United States Patent
Katagiri et al.

(10) Patent No.: US 11,447,658 B2
(45) Date of Patent: Sep. 20, 2022

(54) RESIN COMPOSITION, RESIN SHEET, MULTILAYER PRINTED WIRING BOARD, AND SEMICONDUCTOR DEVICE

(71) Applicant: MITSUBISHI GAS CHEMICAL COMPANY, INC., Tokyo (JP)

(72) Inventors: Shunsuke Katagiri, Tokyo (JP); Takuya Suzuki, Tokyo (JP); Seiji Shika, Tokyo (JP); Yune Kumazawa, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 17/621,918

(22) PCT Filed: Jun. 26, 2020

(86) PCT No.: PCT/JP2020/025142
§ 371 (c)(1),
(2) Date: Dec. 22, 2021

(87) PCT Pub. No.: WO2020/262580
PCT Pub. Date: Dec. 30, 2020

(65) Prior Publication Data
US 2022/0204810 A1 Jun. 30, 2022

(30) Foreign Application Priority Data
Jun. 28, 2019 (JP) .............................. JP2019-122162

(51) Int. Cl.
*C08G 73/12* (2006.01)
*C09D 179/08* (2006.01)
(Continued)

(52) U.S. Cl.
CPC .......... *C09D 179/085* (2013.01); *B32B 27/08* (2013.01); *B32B 27/36* (2013.01);
(Continued)

(58) Field of Classification Search
CPC ...... C09D 17/085; C08G 73/12; B32B 27/08; B32B 27/36; B32B 2255/26
(Continued)

(56) References Cited

U.S. PATENT DOCUMENTS

2019/0281697 A1    9/2019  Abe et al.

FOREIGN PATENT DOCUMENTS

| CN | 108219134 A | 6/2018 |
| JP | 2005-62450 A | 3/2005 |

(Continued)

OTHER PUBLICATIONS

ISR for PCT/JP2020/025142, dated Sep. 1, 2020.
(Continued)

*Primary Examiner* — Ruiyun Zhang
(74) *Attorney, Agent, or Firm* — Greenblum & Bernstein, P L C.

(57) ABSTRACT

The resin composition of the present invention contains a maleimide compound (A) represented by the following formula (1); and a photo initiator (B) having an absorbance of 0.1 or more at a wavelength of 405 nm (h-line).

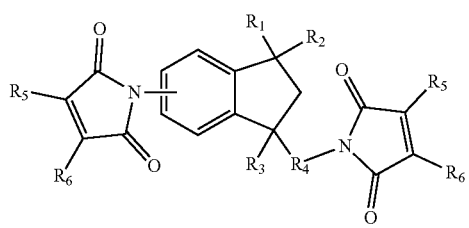

(1)

In the formula (1), $R_1$, $R_2$, and $R_3$ each independently represent an alkyl group or an alkoxy group which may have
(Continued)

a hydrogen atom, a halogen atom, a hydroxyl group, or a substituent, $R_4$ represents an alkylene group, an alkenylene group, an alkoxylene group, or an arylene group which may have a substituent, and $R_5$ and $R_6$ each independently represent a hydrogen atom, a linear or branched alkyl group having 1 to 6 carbon atoms, or a linear or branched alkenyl group having 1 to 6 carbon atoms.

8 Claims, 2 Drawing Sheets

(51) Int. Cl.
*B32B 27/08* (2006.01)
*B32B 27/36* (2006.01)
*H05K 1/03* (2006.01)
*H01L 23/29* (2006.01)

(52) U.S. Cl.
CPC ........... *C08G 73/12* (2013.01); *H05K 1/0346* (2013.01); *B32B 2255/10* (2013.01); *B32B 2255/26* (2013.01); *H01L 23/293* (2013.01)

(58) Field of Classification Search
USPC ........................................ 428/195.1
See application file for complete search history.

(56) References Cited

FOREIGN PATENT DOCUMENTS

| JP | 2010-204298 A | 9/2010 |
| JP | 2011-153248 A | 8/2011 |
| WO | WO 2018/056466 A1 | 3/2018 |

OTHER PUBLICATIONS

Brown et al., "Cross-Linking Reactions in Maleimide and Bis(maleimide) Polymers. An ESR Study", Macromolecules, 23(1): 94-100 (1990).

Taguri, Y., "Examination for applying of ultraviolet curing type water-based coating composition to UV-LED cutting", Research Report 2017 of Industrial Technology Center of SAGA, pp. 69-74 (2018) *cited in ISR (cite No. C01) and in JP Notice of Reasons for Refusal (cite No. C04)*.

Notice of Reasons for Refusal for JP App. No. 2020-555246, dated Dec. 8, 2020 (w/ translation).

Written Opinion of the International Searching Authority issued in International Patent Application No. PCT/JP2020/025142 dated Sep. 1, 2020, along with English translation thereof.

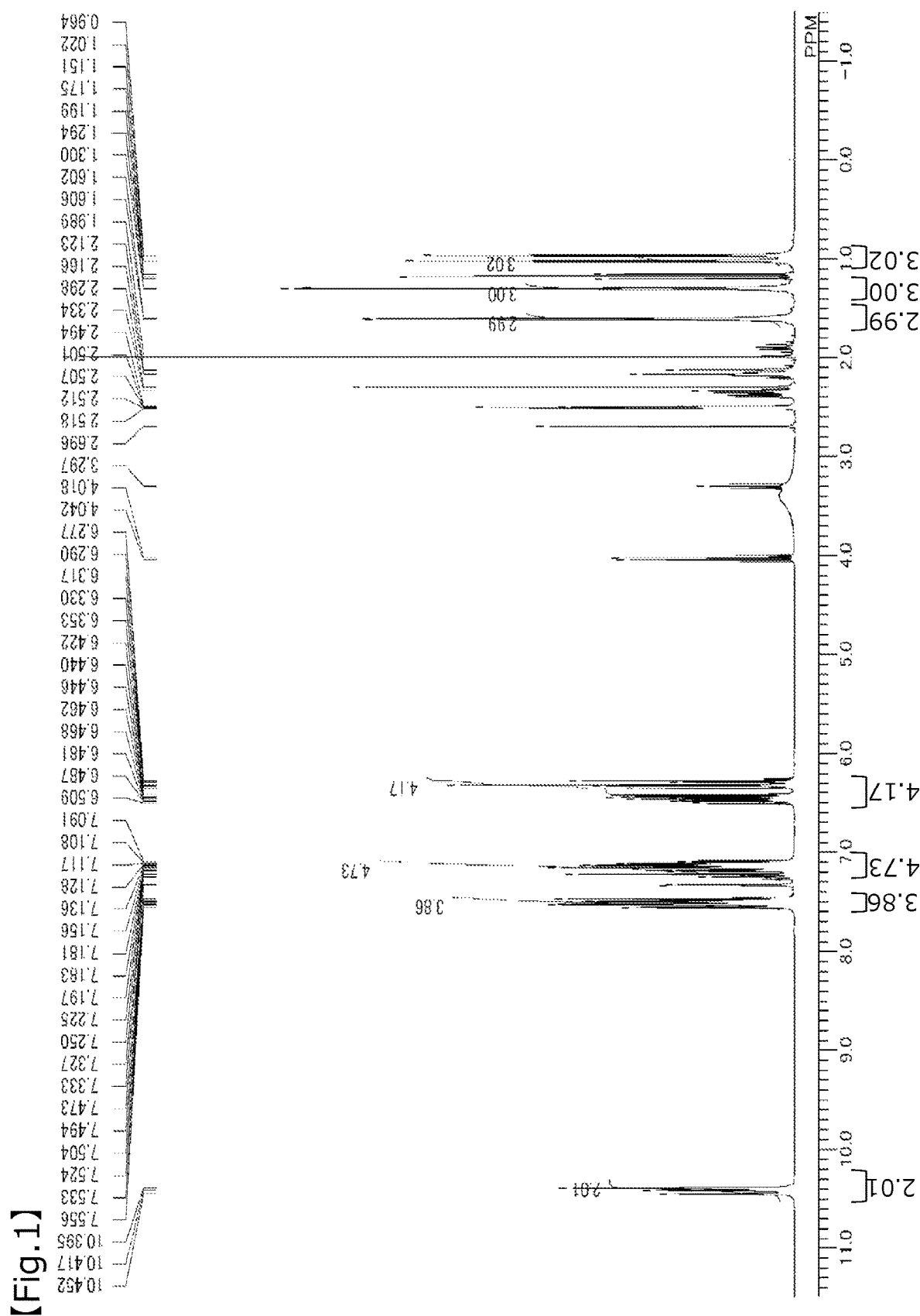
[Fig.1]

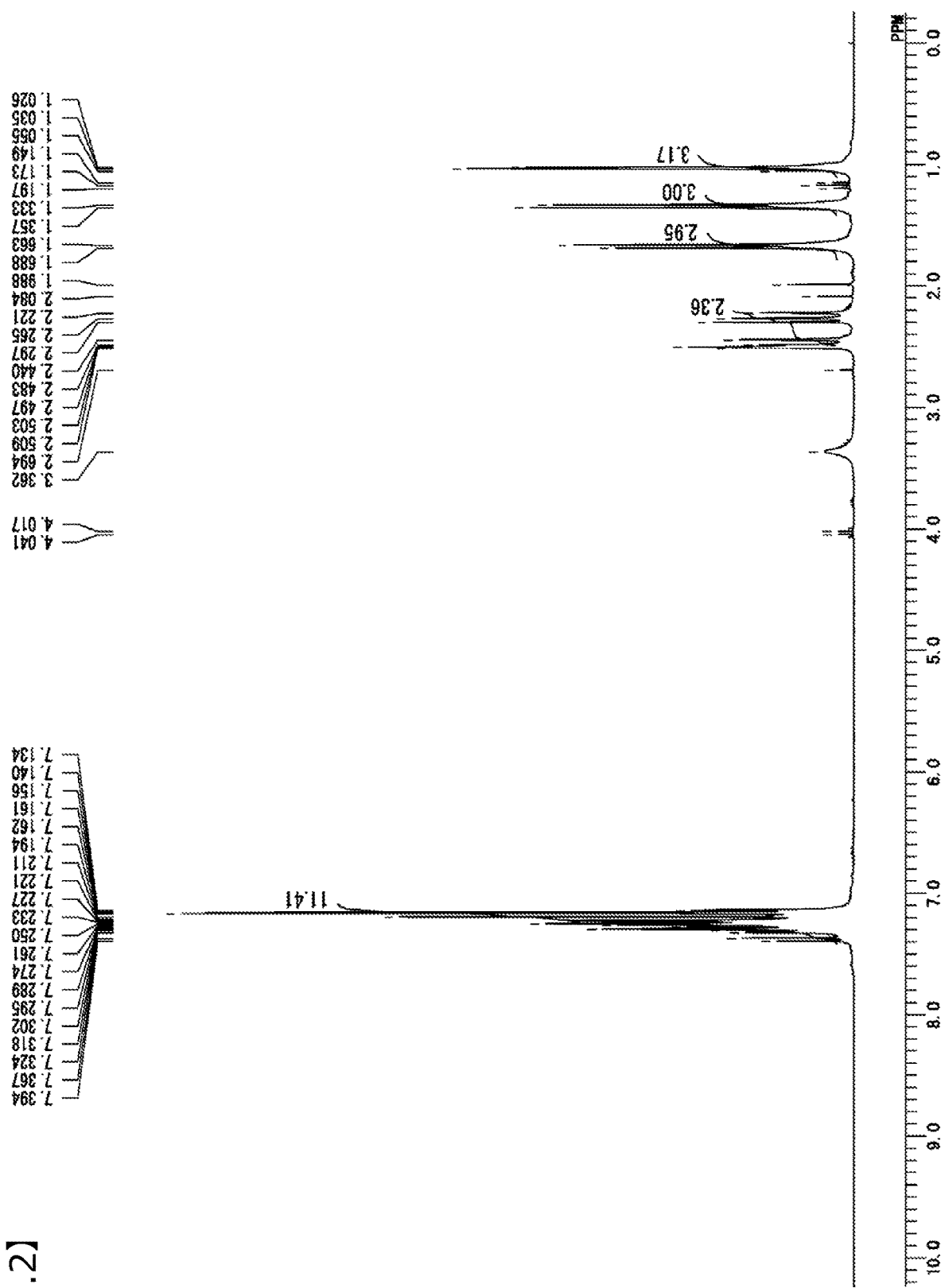

RESIN COMPOSITION, RESIN SHEET, MULTILAYER PRINTED WIRING BOARD, AND SEMICONDUCTOR DEVICE

TECHNICAL FIELD

The present invention relates to a resin composition, a resin sheet, a multilayer printed wiring board, and a semiconductor device.

BACKGROUND ART

Due to the downsizing and densification of multilayer printed wiring boards, studies have been actively conducted to make the laminate used for multilayer printed wiring boards thinner. Along with the thinning, the insulation layer also needs to be made thinner, and a resin sheet not containing glass cloth has been demanded. The resin composition used as the material of the insulation layer is mainly a thermosetting resin, and drilling of holes between insulation layers to obtain conduction is generally carried out by laser processing.

Meanwhile, a problem with the drilling of holes by laser processing is that the processing time becomes longer as the number of holes in a high density substrate becomes larger. In recent years, therefore, there has been a demand for a resin sheet that enables batch drilling in the exposure and development steps by using a resin composition in which an exposed portion is cured by irradiation of rays of light or the like (exposure step) and an unexposed portion can be removed (development step).

As the method of exposure, a method in which a mercury lamp is used as a light source and the exposure is carried out via a photomask is used. Also, in recent years, the introduction of a direct imaging method, in which a pattern is directly drawn on the photosensitive resin composition layer without using a photomask, based on digital data of the pattern, has been progressing as the exposure method. Since this direct imaging method provides better alignment accuracy than the exposure method using a photomask and produces a more detailed pattern, the introduction of this method has been progressing, especially for substrates that require the formation of high density wiring. The light source for this method is a monochromatic light source such as a laser, and in particular, a light source with a wavelength of 405 nm (h-line) is used in devices based on the DMD (Digital Micromirror Device) system, which is capable of forming highly detailed resist patterns.

For the photosensitive resin compositions used in laminates and resin sheets, compounds having an ethylenically unsaturated group, such as (meth)acrylate, are used in order to enable rapid curing in the exposure step.

For example, Patent Document 1 describes a photosensitive thermosetting resin composition containing a carboxyl modified epoxy (meth)acrylate resin, a biphenyl-based epoxy resin, a photo initiator, and a diluent, the carboxyl modified epoxy (meth)acrylate resin being obtained by reacting a bisphenol-based epoxy resin with (meth)acrylic acid and then reacting the resultant with an acid anhydride.

In addition, Patent Document 2 describes a resin composition containing a photocurable binder polymer, a photopolymerization compound having an ethylenically unsaturated bond, a photo (curing) initiator, a sensitizer, and a bisallylnadic imide compound and a bismaleimide compound, which are thermosetting agents.

Patent Document 3 describes a resin composition containing a bismaleimide compound (a curable resin) and a photo radical polymerization initiator (a curing agent) as a photosensitive resin composition used for laminates and resin sheets.

CITATION LIST

Patent Document

Patent Document 1: Japanese Patent Laid-Open No. 2005-62450
Patent Document 2: Japanese Patent Laid-Open No. 2010-204298
Patent Document 3: International Publication No. WO 2018/56466 (A1)

SUMMARY OF INVENTION

Technical Problem

However, cured products using conventional (meth)acrylate-based resins do not provide a sufficient physical property, and are limited in forming protective films with high heat resistance and interlayer insulation layers.

A cured product obtained from the resin composition described in Patent Document 1 is described as having excellent flexibility and folding resistance as a solder resist, and also having excellent heat resistance, but no specific values are given for heat resistance, and thus, it has a problem of inferior heat resistance and thermal stability for use as an interlayer insulation layer.

In Patent Document 2, the use of a bismaleimide compound is described as a thermosetting agent, and (meth)acrylate is used as a photopolymerizable compound. Therefore, it has a problem of inferior heat resistance and thermal stability for use as an interlayer insulation layer.

In Patent Document 3, a bismaleimide compound is used as a curable resin, but since the maleimide compound normally has poor light transmissivity, when the maleimide compound is contained, light does not reach the photo initiator sufficiently, the photo initiator has difficulty generating radicals, and its reactivity is very low. Therefore, in Patent Document 3, the maleimide compound is cured by additional heating before development, and highly detailed resist patterns cannot be obtained because heating is performed. In Patent Document 3, there is no description about using an active energy ray including a wavelength of 405 nm (h-line) as a light source that can be irradiated.

The present invention has been made in view of the problems described above, and an object of the present invention is to provide a resin composition, a resin sheet, and a multilayer printed wiring board and a semiconductor device obtained using these, wherein the resin composition is light-sensitive and photocurable when exposed with an active energy ray including a wavelength of 405 nm (h-line) and has excellent photocurability, heat resistance, and thermal stability, especially when used for multilayer printed wiring boards.

Solution to Problem

The present inventors have found that the problems described above can be solved by using a resin composition comprising a particular maleimide compound (A), and a photo initiator (B) having an absorbance of 0.1 or more at a wavelength of 405 nm (h-line), leading to completion of the present invention.

More specifically, the present invention includes the following contents.

[1] A resin composition comprising: a maleimide compound (A) represented by the following formula (1); and a photo initiator (B) having an absorbance of 0.1 or more at a wavelength of 405 nm (h-line):

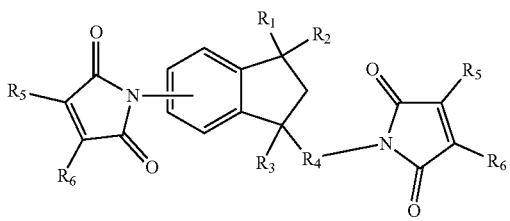
(1)

In the formula (1), $R_1$, $R_2$, and $R_3$ each independently represent an alkyl group or an alkoxy group which may have a hydrogen atom, a halogen atom, a hydroxyl group, or a substituent, $R_4$ represents an alkylene group, an alkenylene group, an alkoxylene group, or an arylene group which may have a substituent, and $R_5$ and $R_6$ each independently represent a hydrogen atom, a linear or branched alkyl group having 1 to 6 carbon atoms, or a linear or branched alkenyl group having 1 to 6 carbon atoms.

[2] The resin composition according to [1], wherein the maleimide compound (A) comprises a compound represented by the following formula (2):

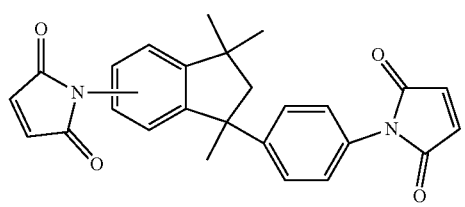
(2)

[3] The resin composition according to [1] or [2], wherein a content of the maleimide compound (A) is 50 to 99.9 parts by mass based on 100 parts by mass in total of the maleimide compound (A) and the photo initiator (B).

[4] The resin composition according to any of [1] to [3], wherein the photo initiator (B) comprises a compound represented by the following formula (3):

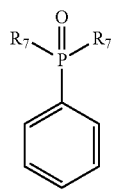
(3)

In the formula (3), each $R_7$ independently represents a substituent represented by the following formula (4) or a phenyl group.

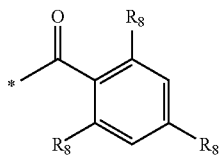
(4)

In the formula (4), -* represents a bonding hand, and each $R_8$ independently represents a hydrogen atom or a methyl group.

[5] A resin sheet comprising: a support; and a resin layer disposed on one surface or both surfaces of the support, wherein the resin layer comprises the resin composition according to any of [1] to [4].

[6] The resin sheet according to [5], wherein the resin layer has a thickness of 1 to 50 μm.

[7] A multilayer printed wiring board comprising: an insulation layer; and a conductor layer formed on one surface or both surfaces of the insulation layer, wherein the insulation layer comprises the resin composition according to any of [1] to [4].

[8] A semiconductor device comprising the resin composition according to any of [1] to [4].

Advantageous Effects of Invention

According to the present invention, a resin composition, a resin sheet, and a multilayer printed wiring board and a semiconductor device obtained using these can be provided, wherein the resin composition is light-sensitive and photocurable when exposed with an active energy ray including a wavelength of 405 nm (h-line) and has excellent photocurability, heat resistance, and thermal stability, especially when used for multilayer printed wiring boards.

BRIEF DESCRIPTION OF DRAWING

FIG. 1 is a $^1$H-NMR chart of the amic acid compound (MA-TMDA) obtained in Example 1.

FIG. 2 is a $^1$H-NMR chart of the maleimide compound (TMDM) obtained in Example 1.

DESCRIPTION OF EMBODIMENT

A mode for carrying out the present invention (hereinafter referred to as "the present embodiment") will be described in detail below, but the present invention is not limited thereto, and various modifications can be made without departing from the spirit thereof.

Note that, in the present specification, the term "(meth)acryloyl group" refers to both "acryloyl group" and "methacryloyl group" corresponding thereto, the term "(meth)acrylate" refers to both "acrylate" and "methacrylate" corresponding thereto, and the term "(meth)acrylic acid" refers to both "acrylic acid" and "methacrylic acid" corresponding thereto. "(Meth)allyl" refers to both "allyl" and "methallyl" corresponding thereto. Also, in the present embodiment, "resin solid content" or "resin solid content in a resin composition" refers to components in a resin composition excluding a photo initiator (B), an additive agent, a solvent, and a filler unless otherwise noted, and "100 parts by mass of resin solid content" refers to the total of components in a resin composition excluding a photo initiator (B), an additive agent, a solvent, and a filler being 100 parts by mass.

[Resin Composition]

The resin composition of the present embodiment contains a maleimide compound (A) represented by the following formula (1), and a photo initiator (B) having an absorbance of 0.1 or more at a wavelength of 405 nm (h-line).

[Maleimide Compound (A) Represented by Formula (1)]

The maleimide compound (A) (also referred to as the "component (A)") according to the present embodiment has the structure of the formula (1).

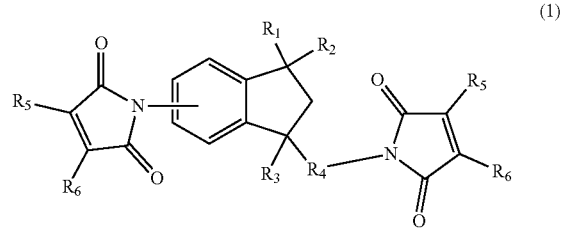

(1)

In the formula (1), $R_1$, $R_2$, and $R_3$ each independently represent an alkyl group or an alkoxy group which may have a hydrogen atom, a halogen atom, a hydroxyl group, or a substituent, $R_4$ represents an alkylene group, an alkenylene group, an alkoxylene group, or an arylene group which may have a substituent, and $R_5$ and $R_6$ each independently represent a hydrogen atom, a linear or branched alkyl group having 1 to 6 carbon atoms, or a linear or branched alkenyl group having 1 to 6 carbon atoms.

Normally, since maleimide compounds have poor light transmissivity, when the resin composition contains a maleimide compound, light does not sufficiently reach the photo initiator dispersed in the resin composition, and the photo initiator has difficulty generating radicals. Therefore, in general, the photo radical reaction of a maleimide is difficult to proceed, and even if radical polymerization or dimerization reaction of single maleimide proceeds, its reactivity is very low. However, the maleimide compound (A) has exceptional light transmissivity because it has an alicyclic skeleton. Therefore, sufficient light reaches the photo initiator and the photo radical reaction of the maleimide occurs efficiently together with the photo initiator (B), which will be mentioned later. The maleimide compound (A) exhibits excellent light transmissivity, with a light transmittance of 0.01% or more, when a chloroform solution containing the compound at 1% by mass is prepared and the light transmittance of this chloroform solution is measured using a ray of light with a wavelength of 405 nm (h-line). Therefore, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. Note that the upper limit of the transmittance is normally 99.99% or less.

On the other hand, the absorbance of the photo initiator normally tends to decrease when a ray of light having a long wavelength is used. For example, when an active energy ray (ray of light) including a wavelength of 405 nm (h-line) is used, a usual photo initiator does not absorb the ray because light having such a wavelength has a relatively long wavelength, and polymerization proceeds only when a photo initiator capable of suitably absorbing the light to generate radicals is used. That is, even if a maleimide compound having light transmissivity is used, the polymerization does not proceed unless the photo initiator absorbs the light with a wavelength of 405 nm (h-line) and generates radicals. However, the photo initiator according to the present embodiment, which will be mentioned later, exhibits exceptional absorption of the light with a wavelength of 405 nm (h-line), with an absorbance of 0.1 or more at a wavelength of 405 nm (h-line).

Since the maleimide compound (A) has excellent light transmissivity as mentioned above, light reaches the photo initiator sufficiently even when a light with a wavelength of 405 nm is used, radical reaction using radicals generated from the photo initiator proceeds, and even a composition containing a large amount of the maleimide compound (A) can be photocured. According to the present embodiment, homopolymerization of the maleimide compound (A) is also possible.

Since the cured material obtained from the resin composition of the present embodiment is suitably photocured, it has excellent heat resistance, insulation reliability, and thermal stability. Therefore, according to the present embodiment, the protective film and the insulation layer in the multilayer printed wiring board and the semiconductor device can be suitably formed.

In the formula (1), $R_1$, $R_2$ and $R_3$ each independently represent a hydrogen atom, a halogen atom, a hydroxyl group, an alkyl group or an alkoxy group. The alkyl group or alkoxy group may have a substituent.

Examples of the halogen atom include a fluorine atom, a chlorine atom, a bromine atom, and an iodine atom.

Examples of the alkyl group which may have a substituent include a linear or branched alkyl group having 1 to 8 carbon atoms which may have a substituent. Examples thereof include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, and a heptyl group. The hydrogen atom in the alkyl group may be replaced by a halogen atom such as a fluorine atom or a chlorine atom; a cyano group, or the like. Among these alkyl groups, it is preferably a methyl group, an ethyl group, an isopropyl group, or a tert-butyl group, more preferably a methyl group, an ethyl group, or a tert-butyl group, and still more preferably a methyl group from the viewpoint of having superior photocurability, heat resistance, and thermal stability, and exhibiting a good solubility in a solvent, a low melting point, low water absorbency, and a good compatibility with other resins.

Examples of the alkoxy group which may have a substituent include a linear or branched alkoxy group having 1 to 4 carbon atoms which may have a substituent. Examples thereof include a methoxy group, an ethoxy group, a propoxy group, an isopropoxy group, a n-butoxy group, an isobutoxy group, and a tert-butoxy group. The hydrogen atom in the alkoxy group may be replaced by a halogen atom such as a fluorine atom or a chlorine atom; a cyano group, or the like. Among these alkoxy groups, a methoxy group is preferable from the viewpoint of having superior photocurability, heat resistance, and thermal stability, and exhibiting a good solubility in a solvent, a low melting point, a low water absorbency, and a good compatibility with other resins.

In the formula (1), $R_4$ represents an alkylene group, an alkenylene group, an alkoxylene group, or an arylene group. These groups may have a substituent.

Examples of the alkylene group which may have a substituent include a linear or branched alkylene group having 1 to 8 carbon atoms which may have a substituent.

Examples thereof include a methylene group, an ethylene group, a propylene group, an isopropylene group, a n-butylene group, an isobutylene group, a tert-butylene group, a n-pentylene group, a 1-ethylpropylene group, a 2,2-dimethylpropylene group, and a hexylene group. The hydrogen atom in the alkoxy group may be replaced by a halogen atom such as a fluorine atom or a chlorine atom; a cyano group, or the like. Among these alkylene groups, a methylene group is preferable from the viewpoint of having superior photocurability, heat resistance, and thermal stability, and exhibiting a good solubility in a solvent, a low melting point, a low water absorbency, and a good compatibility with other resins.

Examples of the alkenylene group which may have a substituent include a linear or branched alkenylene group having 1 to 10 carbon atoms which may have a substituent. Examples thereof include a vinylene group, a 1-methylvinylene group, an arylene group, a propenylene group, an isopropenylene group, a 1-butenylene group, a 2-butenylene group, a 1-pentenylene group, a 2-pentenylene group, an isopentenylene group, a cyclopentenylene group, a cyclohexenylene group and a dicyclopentadienylene group. The hydrogen atom in the alkenylene group may be replaced by a halogen atom such as a fluorine atom or a chlorine atom; a cyano group, or the like. Among these alkenylene groups, a vinylene group is preferable from the viewpoint of having superior photocurability, heat resistance, and thermal stability, and exhibiting a good solubility in a solvent, a low melting point, a low water absorbency, and a good compatibility with other resins.

Examples of the alkoxylene group which may have a substituent include a linear or branched alkoxylene group having 1 to 4 carbon atoms which may have a substituent. Examples thereof include a methoxylene group, an ethoxylene group, a propoxylene group, an isopropoxylene group, a butoxylene group, and an isobutoxylene group. The hydrogen atom in the alkoxylene group may be replaced by a halogen atom such as a fluorine atom or a chlorine atom; a cyano group, or the like. Among these alkoxylene groups, a methoxylene group is preferable from the viewpoint of having superior photocurability, heat resistance, and thermal stability, and exhibiting a good solubility in a solvent, a low melting point, a low water absorbency, and a good compatibility with other resins.

Examples of the arylene group which may have a substituent include an arylene group having 6 to 48 carbon atoms which may have a substituent. Examples thereof include a phenylene group such as a 1,4-phenylene group, a 1,3-phenylene group, and a 1,2-phenylene group; a naphthalenediyl group such as a 1,4-naphthalenediyl group, a 1,5-naphthalenediyl group, a 2,6-naphthalenediyl group, and a 2,7-naphthalenediyl group; an anthracenediyl group such as a 1,4-anthracenediyl group, a 1,5-anthracenediyl group, a 2,6-anthracenediyl group, and a 9,10-anthracenediyl group; a phenanthrenediyl group such as a 2,7-phenanthrenediyl group; a dihydrophenanthrenediyl group such as a 9,10-dihydrophenanthrene-2,7-diyl group; a naphthacenediyl group such as a 1,7-naphthacenediyl group, a 2,8-naphthacenediyl group, and a 5,12-naphthacenediyl group; a fluorenediyl group such as a 2,7-fluorenediyl group, and a 3,6-fluorenediyl group; a pyrenediyl group such as a 1,6-pyrenediyl group, a 1,8-pyrenediyl group, a 2,7-pyrenediyl group, and a 4,9-pyrenediyl group; a perylenediyl group such as a 3,8-perylenediyl group, a 3,9-perylenediyl group, and a 3,10-perylenediyl group; and a spirofluorenediyl group such as a 9,9'-spirofluorene-2,7-diyl group, a 9,9'-spirofluorene-3,6-diyl group, and a 9,9'-spirofluorene-2,2'-diyl group. The hydrogen atom in the arylene group may be substituted by a halogen atom such as a fluorine atom or a chlorine atom; a cyano group, or the like. Among these alkoxylene groups, a 1,4-phenylene group is preferable from the viewpoint of having superior photocurability, heat resistance, and thermal stability, and exhibiting a good solubility in a solvent, a low melting point, a low water absorbency, and a good compatibility with other resins.

In the formula (1), $R_5$ and $R_6$ each independently represent a hydrogen atom, a halogen atom, a linear or branched alkyl group having 1 to 6 carbon atoms, or a linear or branched alkenyl group having 1 to 6 carbon atoms. $R_5$ and $R_6$ may all be the same or different.

As the halogen atom and the linear or branched alkyl group having 1 to 6 carbon atoms, the above description of $R_1$ can be referred to.

Examples of the linear or branched alkenyl group having 1 to 6 carbon atoms include, but are not particularly limited to, a vinyl group, an allyl group, a 4-pentenyl group, an isopropenyl group, and an isopentenyl group.

As $R_5$ and $R_6$, a hydrogen atom and a methyl group is preferable, and more preferably, all $R_5$ and $R_6$ are hydrogen atoms from the viewpoint of having superior photocurability, heat resistance, and thermal stability, and exhibiting a good solubility in a solvent, a low melting point, a low water absorbency, and a good compatibility with other resins.

The maleimide compound (A) is preferably represented by the formula (2) from the viewpoint of having superior photocurability, heat resistance, and thermal stability, and exhibiting a good solubility in a solvent, a low melting point, a low water absorbency, and a good compatibility with other resins.

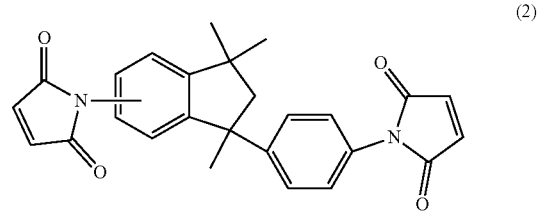

(2)

In the resin composition of the present embodiment, the content of the maleimide compound (A) is preferably 50 to 99.9 parts by mass, more preferably 60 to 99.9 parts by mass, yet more preferably 70 to 99.8 parts by mass, even yet more preferably 80 to 99.7 parts by mass, still even yet more preferably 85 to 99 parts by mass, and particularly preferably 90 to 95 parts by mass based on 100 parts by mass of the total of the maleimide compound (A) and the photo initiator (B) from the viewpoint that it becomes possible to obtain a cured product mainly composed of the maleimide compounds and photocurability, heat resistance, and thermal stability are improved.

Moreover, the content of the maleimide compound (A) in the resin composition of the present embodiment is preferably 5 to 100 parts by mass, more preferably 5 to 99.9 parts by mass, yet more preferably 10 to 95 parts by mass, even yet more preferably 15 to 85 parts by mass, still even yet more preferably 20 to 83 parts by mass, particularly preferably 55 to 80 parts by mass, and more particularly preferably 70 to 80 parts by mass based on 100 parts by mass of the resin solid content in the resin composition from the viewpoint that it becomes possible to obtain a cured product mainly composed of the maleimide compounds and photocurability, heat resistance, and thermal stability are improved. A content of the maleimide compound (A) in the resin composition of 100 parts by mass means that the resin content is made of the maleimide compound (A) alone.

One of the maleimide compounds (A) can be used, or two or more thereof can be appropriately mixed and used.

[Method for Producing Maleimide Compound (A) Represented by Formula (1)]

The maleimide compound (A) can be obtained, for example, by the following synthesis method. That is, the maleimide compound (A) can be obtained by subjecting the amine compound represented by the formula (5) and the acid anhydride represented by the formula (6) to an addition reaction to obtain the amic acid compound represented by the formula (7), then subjecting the obtained amic acid compound to a ring closure reaction with dehydration.

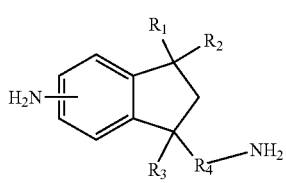

(5)

In the formula (5), $R_1$, $R_2$, and $R_3$ each independently represent an alkyl group or an alkoxy group which may have a hydrogen atom, a halogen atom, a hydroxyl group, or a substituent, and $R_4$ represents an alkylene group, an alkenylene group, an alkoxylene group, or an arylene group which may have a substituent.

$R_1$, $R_2$, $R_3$, and $R_4$ are the same as in the formula (1), including the preferred aspects.

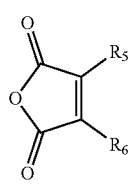

(6)

In the formula (6), $R_5$ and $R_6$ each independently represent a hydrogen atom, a linear or branched alkyl group having 1 to 6 carbon atoms, or a linear or branched alkenyl group having 1 to 6 carbon atoms.

$R_5$ and $R_6$ are the same as in the formula (1), including the preferred aspects.

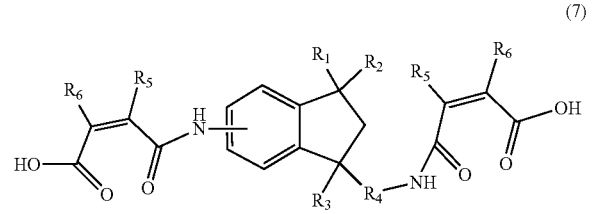

(7)

In the formula (7), $R_1$, $R_2$, and $R_3$ each independently represent an alkyl group or an alkoxy group which may have a hydrogen atom, a halogen atom, a hydroxyl group, or a substituent, $R_4$ represents an alkylene group, an alkenylene group, an alkoxylene group, or an arylene group which may have a substituent, and $R_5$ and $R_6$ each independently represent a hydrogen atom, a linear or branched alkyl group having 1 to 6 carbon atoms, or a linear or branched alkenyl group having 1 to 6 carbon atoms.

$R_1$, $R_2$, $R_3$, $R_4$, $R_5$ and $R_6$ are the same as in the formula (1), including the preferred aspects.

(Method for Synthesizing Amic Acid Compound Represented by Formula (7))

The amic acid compound represented by the formula (7) can be obtained, for example, by the following synthesis method. That is, the amic acid compound can be obtained by subjecting the amine compound represented by the formula (5) and the acid anhydride represented by the formula (6) to an addition reaction.

Examples of the amine compound represented by the formula (5) include 5-amino-1,3,3-trimethyl-1-(4-aminophenyl)-indane, 6-amino-1,3,3-trimethyl-1-(4-aminophenyl)-indane, 5-amino-1-ethyl-3,3-dimethyl-1-(4-aminophenyl)-indane, 6-amino-1-ethyl-3,3-dimethyl-1-(4-aminophenyl)-indane, 5-amino-1,3-diethyl-3-methyl-1-(4-aminophenyl)-indane, 6-amino-1,3-diethyl-3-methyl-1-(4-aminophenyl)-indane, 5-amino-1,3,3-triethyl-1-(4-aminophenyl)-indane, 6-amino-1,3,3-triethyl-1-(4-aminophenyl)-indane, 5-amino-1,3,3-tripropyl-1-(4-aminophenyl)-indane, 6-amino-1,3,3-tripropyl-1-(4-aminophenyl)-indane, 5-amino-1,3,3-trimethyl-1-(3-aminophenyl)-indane, 6-amino-1,3,3-trimethyl-1-(3-aminophenyl)-indane, 5-amino-1,3,3-trimethyl-1-(2-aminophenyl)-indane, and 6-amino-1,3,3-trimethyl-1-(2-aminophenyl)-indane. These amine compounds can be used singly or in combination of two or more.

As these amine compounds, commercial products can also be used.

Examples of the acid anhydride represented by the formula (6) include maleic anhydride, 3-methylmaleic anhydride, 3-ethylmaleic anhydride, 3,4-dimethylmaleic anhydride, 3,4-diethylmaleic anhydride, 3-chloromaleic anhydride, and 3,4-dichloromaleic anhydride. These acid anhydrides can be used singly or in combination of two or more.

The amount of the acid anhydride represented by the formula (6) is usually 1.5 to 3.0 times, preferably 1.8 to 2.2 times, based on 1 mol of the amine compound represented by the formula (5).

For the addition reaction, the entire amount of the amine compound and the acid anhydride may be introduced from the beginning. However, since the reaction between the amine compound and the acid anhydride is an exothermic reaction, it is preferable to react them while suppressing excessive heat generation by adding either one in small amounts. More preferably, the acid anhydride is dissolved in a solvent, and the amine compound is added dropwise while stirring the mixture under normal pressure (1 atm) so that the internal temperature of the reaction vessel is maintained at 100° C. or lower, preferably in the range of 30 to 100° C. In this case, the amine compound, which is the raw material to be added dropwise, may be dissolved in the same solvent as the reaction solvent. The dropping time of the amine compound (raw material) is preferably 5 to 180 minutes, but it is more preferable to add dropwise the entire amount in the range of 30 to 120 minutes. Moreover, the addition reaction is preferably carried out in an atmosphere of an inert gas such as nitrogen, helium or argon.

Immediately after completing the dropping of the amine compound (raw material), a ring closure reaction with dehydration of the produced amic acid compound may be carried out, but it is preferable to age the amic acid compound at 30 to 120° C. for about 0.5 to 3.0 hours, and more preferably to age it at 50 to 100° C. for about 1.0 to 2.0 hours, then subject it to a ring closure reaction with dehydration.

The addition reaction is preferably carried out in an organic solvent. Examples of the organic solvent include a saturated hydrocarbon such as pentane, hexane, heptane, and cyclohexane; an aromatic hydrocarbon such as benzene, toluene, xylene, and ethylbenzene; a halogenated hydrocarbon such as dichloromethane, chloroform, carbon tetrachloride, dichloroethane, chlorobenzene, and dichlorobenzene; an ether such as diethyl ether, diisopropyl ether, 1,2-dimethoxyethane, bis(2-methoxyethyl)ether, 1,2-bis(2-methoxyethoxy)ethane, bis[2-(2-methoxyethoxy)ethyl]ether, tetrahydrofuran, 1,3-dioxane, 1,4-dioxane, and anisole; a phenol such as phenol, o-chlorophenol, m-chlorophenol, p-chlorophenol, o-cresol, m-cresol, p-cresol, 2,3-xylenol, 2,4-xylenol, 2,5-xylenol, 2,6-xylenol, 3,4-xylenol, and 3,5-xylenol; an amide such as N,N-dimethylformamide, N,N-dimethylacetamide, N,N-diethylacetamide, N,N-dimethylmethoxyacetamide, and hexamethylphosphoramide; a lactam such as N-methylpyrrolidone (NMP) and N-methylcaprolactam; a sulfur-containing solvent such as dimethyl sulfoxide, diphenyl sulfoxide, dimethyl sulfone, diphenyl sulfone, and sulfolane; and 1,3-dimethyl-2-imidazolidinone. These organic solvents can be used singly or in combination of two or more.

Moreover, the following solvents may be additionally present with these organic solvents. Examples of such organic solvents include benzene, toluene, o-xylene, m-xylene, p-xylene, o-chlorotoluene, m-chlorotoluene, p-chlorotoluene, o-bromotoluene, m-bromotoluene, p-bromotoluene, chlorobenzene, and bromobenzene. These act as azeotropic solvent for removing (dehydrating) the water produced in the reaction solution. These organic solvents can be used singly or in combination of two or more.

The amount of organic solvent to be used is not particularly limited and varies depending on the solvent type and composition used, but is usually 1 to 1000 parts by mass, preferably 31 to 100 parts by mass based on 1 part by mass of the total of the amine compound (raw material) and the acid anhydride. The reaction solvent is preferably a solution obtained by dissolving the raw material, but the reaction may also be carried out in a slurry state.

(Method for Synthesizing Maleimide Compound Represented by Formula (1))

The maleimide compound (A) represented by the formula (1) can be obtained, for example, by the following synthesis method. That is, the maleimide compound (A) can be obtained by subjecting the amic acid compound represented by the formula (7) obtained by the above synthesis method to a ring closure reaction with dehydration. Moreover, the ring closure reaction with dehydration is preferably carried out in an organic solvent. As the organic solvent, the solvents used in the above addition reaction can be referred to, and it may be the same as or different from the solvent used in the addition reaction.

The ring closure reaction with dehydration is preferably carried out in the presence of an organic base catalyst, an acid catalyst, or an imidizing agent, if necessary.

Examples of the organic base catalyst include triethylamine, tributylamine, trypentylamine, N,N-dimethylaniline, N,N-diethylaniline, pyridine, α-picoline, β-picoline, γ-picoline, 2,4-lutidine, 2,6-lutidine, quinoline, and isoquinoline. These organic base catalysts can be used singly or in combination of two or more.

Examples of the acid catalyst include an inorganic acid such as hydrochloric acid, hydrogen bromide, hydrogen iodide, sulfuric acid, anhydrous sulfuric acid, nitric acid, phosphoric acid, phosphorus acid, phosphotungstic acid, and phosphomolybdic acid; a sulfonic acid such as methanesulfonic acid, ethanesulfonic acid, trifluoromethanesulfonic acid, benzenesulfonic acid, and p-toluenesulfonic acid; a carboxylic acid such as acetic acid and oxalic acid; a halogenated carboxylic acid such as chloroacetic acid, dichloroacetic acid, trichloroacetic acid, fluoroacetic acid, difluoroacetic acid, and trifluoroacetic acid; a solid acid such as silica, alumina, and activated clay; and a cationic ion exchange resin. In addition, these acid catalysts may be salts of a diamine compound. Of these, sulfuric acid, phosphoric acid, and p-toluenesulfonic acid are preferable. These acid catalysts can be used singly or in combination of two or more.

The amount of the organic base catalyst and the acid catalyst to be used is not particularly limited as long as the reaction rate of the ring closure reaction with dehydration is substantially improved, but is usually 0.001 to 10 times, preferably 0.005 to 5 times, more preferably 0.01 to 1 time the molar amount of the amine compound (raw material).

As the imidizing agent, for example, acetic anhydride or the like can be used as a dehydrating agent, and a publicly known method (for example, the methods described in Japanese Patent Publication No. 46-23250, Japanese Patent Publication No. 49-40231, and Japanese Patent Publication No. 59-52660), in which the reaction is carried out in an organic solvent in the presence of a catalyst and a base, can be used. In addition, a condensing agent such as polyphosphate and dicyclohexylcarbodiimide can also be used as the imidizing agent.

If a dehydrating agent (acetic anhydride or the like) is used as the imidizing agent, the amount to be used is usually preferably 1.0 to 10 times, and more preferably 1.8 to 6.0 times based on 1 mol of the amine compound (raw material).

Examples of the catalyst include an oxide of alkaline earth metals, a carbonate, a sulfate, a phosphate, and an acetate of iron (II and III), nickel (II), manganese (II and III), copper (I and II) or cobalt (II and III). These catalysts can be used singly or in combination of two or more. The amount of catalyst to be used is usually $5 \times 10^{-4}$ to 0.1 mol per 1 mol of the amic acid compound.

Examples of the base include sodium acetate, potassium acetate, trimethylamine, triethylamine, and tributylamine. These bases can be used singly or in combination of two or more. The amount of base to be used is usually 0.05 to 1.1 mol per 1 mol of the amic acid compound.

The reaction temperature and reaction time for the ring closure reaction with dehydration vary depending on the type of raw material, the type of solvent, the type of catalyst, the type and amount of solvent for azeotropic dehydration, and the type and amount of imidizing agent used, but are usually in the range of 20 to 180° C. and 1 to 24 hours. In addition, the reaction pressure is usually the atmospheric pressure. The reaction atmosphere is usually an atmosphere of air, nitrogen, helium, neon, or argon, and the reaction is preferably carried out in an atmosphere of nitrogen or argon, which are inert gas.

The method for isolating the target maleimide compound from the reaction mixture containing the maleimide compound is not particularly limited, but the target compound can be isolated by filtration or centrifugation when it is precipitated from the reaction solvent. On the other hand, when the target compound is dissolved in the reaction solvent, it can be isolated by filtration or centrifugation after precipitating it by distilling off the solvent under reduced pressure, adding an appropriate poor solvent to the reaction mixture, or discharging the reaction mixture into a poor solvent.

When it is necessary to further purify the isolated maleimide compound, it may be purified by adopting a publicly known method. Examples of such a method include purification by distillation, recrystallization, column chromatography, sludge disposal, and activated carbon treatment.

The obtained maleimide compound can be identified by a publicly known method such as NMR (nuclear magnetic resonance analysis). The purity of the maleimide compound can be analyzed by, for example, liquid chromatography or IR spectroscopy. Volatile components such as by-products and residual solvents in the maleimide compound can be quantitatively analyzed by, for example, gas chromatography. The halogen compounds remaining in the maleimide compound can be identified by, for example, a liquid chromatograph mass spectrometer, and can be quantified by ion chromatography after potentiometric titration using a silver nitrate solution or decomposition by combustion. The polymerization reactivity of the maleimide compound can be evaluated by, for example, the reaction enthalpy obtained by differential scanning calorimetry and the gel time obtained by the hot plate method or torque measurement.

[Photo Initiator (B)]

The photo initiator (B) according to the present embodiment (also referred to as component (B)) is not particularly limited as long as it has an absorbance of 0.1 or more at a wavelength of 405 nm (h-line), and those publicly known in the field generally used in photocurable resin compositions can be used. In the present embodiment, the photo initiator (B) refers to a compound having an absorbance of 0.1 or more at a wavelength of 405 nm (h-line), and which releases an active substance (radical) capable of polymerizing the maleimide group of the maleimide compound (A) upon irradiation with an active energy ray having a wavelength of 405 nm (h-line). In addition, having an absorbance of 0.1 or more at a wavelength of 405 nm (h-line) means that when a chloroform solution containing the component (B) at 0.01% by mass is prepared and the absorbance of this chloroform solution is measured using a ray of light with a wavelength of 405 nm (h-line), the absorbance is 0.1 or more. When such a photo initiator (B) is used, for example, upon producing a printed wiring board having a highly dense and highly detailed wiring formation (pattern) using the direct imaging method, the photo radical reaction of the maleimide occurs efficiently even when an active energy ray including a wavelength of 405 nm (h-line) is used. The absorbance is preferably 0.15 or more. The upper limit is, for example, 99.9 or less.

As the photo initiator (B), a compound represented by the formula (3) is preferable. As for the compound represented by the formula (3), when a chloroform solution containing this compound at 0.01% by mass is prepared and the absorbance of this chloroform solution is measured using a ray of light with a wavelength of 405 nm (h-line), the absorbance is 0.1 or more, exhibiting exceptional absorption of the light with a wavelength of 405 nm (h-line). Therefore, this compound suitably generates radicals in response to the light with a wavelength of 405 nm (h-line). The absorbance is preferably 0.15 or more because a resin composition that is superior in photocurability can be obtained. The upper limit is, for example, 2.0 or less.

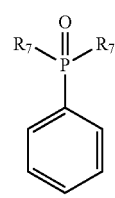

(3)

In the formula (3), each $R_7$ independently represents a substituent represented by the formula (4) or a phenyl group.

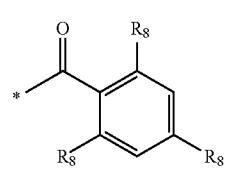

(4)

In the formula (4), each $R_8$ independently represents a hydrogen atom or a methyl group. In the formula (4), -* represents a bonding hand to a phosphorus atom (P) in the formula (3).

In the formula (2), each $R_7$ independently represents a substituent represented by the formula (4) or a phenyl group. It is preferable that one or more among $R_7$s be the substituents represented by the formula (4).

In the formula (4), each $R_8$ independently represents a hydrogen atom or a methyl group. It is preferable that one or more among $R_8$s be methyl groups, and it is more preferable that all should be methyl groups.

Examples of the compound represented by the formula (3) include acylphosphine oxides such as 2,4,6-trimethylbenzoyl-diphenyl-phosphine oxide and bis(2,4,6-trimethylbenzoyl)-phenylphosphine oxide. One of these compounds can be used, or two or more thereof can be appropriately mixed and used.

Acylphosphine oxides exhibit exceptional absorption of an active energy ray including a wavelength of 405 nm (h-line) and can suitably radical polymerize the maleimide compound (A). Therefore, a resin composition, a resin sheet with a support, and a multilayer printed wiring board and a semiconductor device obtained using these can be suitably produced, wherein the resin composition has excellent photocurability, heat resistance, and thermal stability, especially when used for multilayer printed wiring boards.

In the resin composition of the present embodiment, the content of the photo initiator (B) is preferably 0.1 to 50 parts by mass, more preferably 0.1 to 40 parts by mass, yet more preferably 0.2 to 30 parts by mass, even yet more preferably 0.3 to 20 parts by mass, still even yet more preferably 1 to 15 parts by mass, and particularly preferably 5 to 10 parts by mass based on 100 parts by mass of the total of the maleimide compound (A) and the photo initiator (B) from the viewpoint that the maleimide compound (A) is sufficiently cured by using an active energy ray including a wavelength of 405 nm (h-line), thereby improving the heat resistance.

As the photo initiator (B), commercial products can also be used, and examples thereof include Omnirad (registered trademark) 819 (product name) manufactured by IGM Resins B.V., Omnirad (registered trademark) 819 DW (product name) manufactured by IGM Resins B.V., and Omnirad (registered trademark) TPO (product name) manufactured by IGM Resins B.V.

[Resin or Compound]

The resin composition of the present embodiment can further contain one or more resin or compound selected from the group consisting of a maleimide compound other than the maleimide compound (A) (hereinafter, also referred to as "other maleimide compound"), a cyanate compound, a phenolic resin, an epoxy resin, an oxetane resin, a benzoxazine compound, a carbodiimide compound, and a compound having an ethylenically unsaturated group. The maleimide compound (A) has exceptional light transmissivity, so that even when these resins or compounds are used, light reaches the photo initiator sufficiently, the photo radical reaction of the maleimide efficiently takes place, and photocuring can be performed using various active energy rays. Therefore, light reaches the photo initiator sufficiently, for example, even when an active energy ray including a wavelength of 405 nm is used, radical reaction using radicals generated from the photo initiator proceeds, and even a composition containing these resins or compounds can be photocured. These components will be described below.

(Other Maleimide Compound)

In the resin composition, a maleimide compound other than the maleimide compound (A) can be used as long as the resin composition is photosensitized and photocured when exposed to an active energy ray including a wavelength of 405 nm (h-line).

The other maleimide compound is not particularly limited as long as it is a compound other than the maleimide compound (A) and has one or more maleimide groups in the molecule. Specific examples thereof include N-phenylmaleimide, N-cyclohexylmaleimide, N-hydroxyphenylmaleimide, N-anilinophenylmaleimide, N-carboxyphenylmaleimide, N-(4-carboxy-3-hydroxyphenyl)maleimide, fluorescein-5-maleimide, 6-maleimidohexanoic acid, 4-maleimidobutyric acid, bis(4-maleimidophenyl)methane, 2,2-bis(4-(4-maleimidophenoxy)-phenyl)propane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanebismaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,2-bis(maleimido)ethane, 1,4-bis(maleimido)butane, 1,5-bis(maleimido)pentane, 1,5-bismaleimido-2-methylpentane, 1,6-bis(maleimido)hexane, 1,6-bismaleimido-(2,2,4-trimethyl)hexane, 1,8-bismaleimido-3,6-dioxaoctane, 1,11-bismaleimido-3,6,9-trioxaundecane, 1,3-bis(maleimidomethyl)cyclohexane, 1,4-bis(maleimidomethyl)cyclohexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, a maleimide compound represented by the formula (8), a maleimide compound represented by the formula (9), a maleimide compound represented by the formula (10), a maleimide compound represented by the formula (11), a maleimide compound represented by the formula (12) such as the maleimide compound represented by the formula (19), a maleimide compound represented by the formula (13), a maleimide compound represented by the formula (14), a maleimide compound represented by the formula (15), 1,6-bismaleimido-(2,2,4-trimethyl)hexane (maleimide compound represented by the formula (16)), a maleimide compound represented by the formula (17), and a maleimide compound represented by the formula (18), as well as a prepolymer of these maleimide compounds, or a prepolymer of maleimide compounds and amine compounds. Among these, the maleimide compound represented by the formula (12) and the maleimide compound represented by the formula (18) are preferred, and the maleimide compound represented by the formula (18) is more preferred because they have a superior photocurability, heat resistance, and thermal stability.

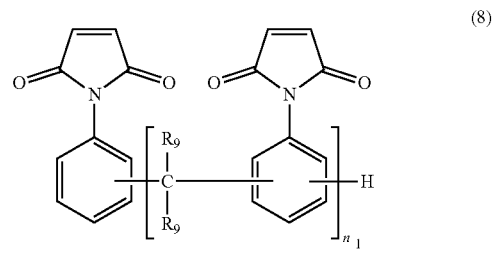

(8)

In the formula (8), each $R_9$ independently represents a hydrogen atom or a methyl group. $n_1$ represents an integer of 1 or more, preferably represents an integer of 1 to 10, and more preferably represents an integer of 1 to 5.

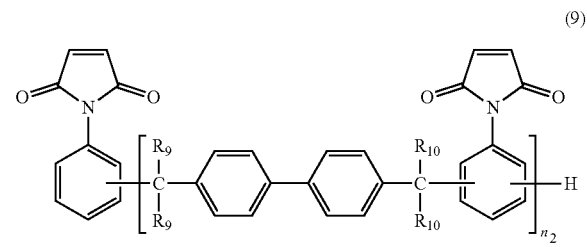

(9)

In the formula (9), each $R_{10}$ independently represents a hydrogen atom or a methyl group. $n_2$ represents an integer of 1 or more and preferably represents an integer of 1 to 5.

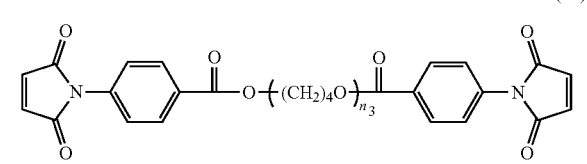

(10)

In the formula (10), $n_3$ (average) is 1 or more, preferably 1 to 21, and from the viewpoint of exhibiting excellent photocurability, more preferably 1 to 16.

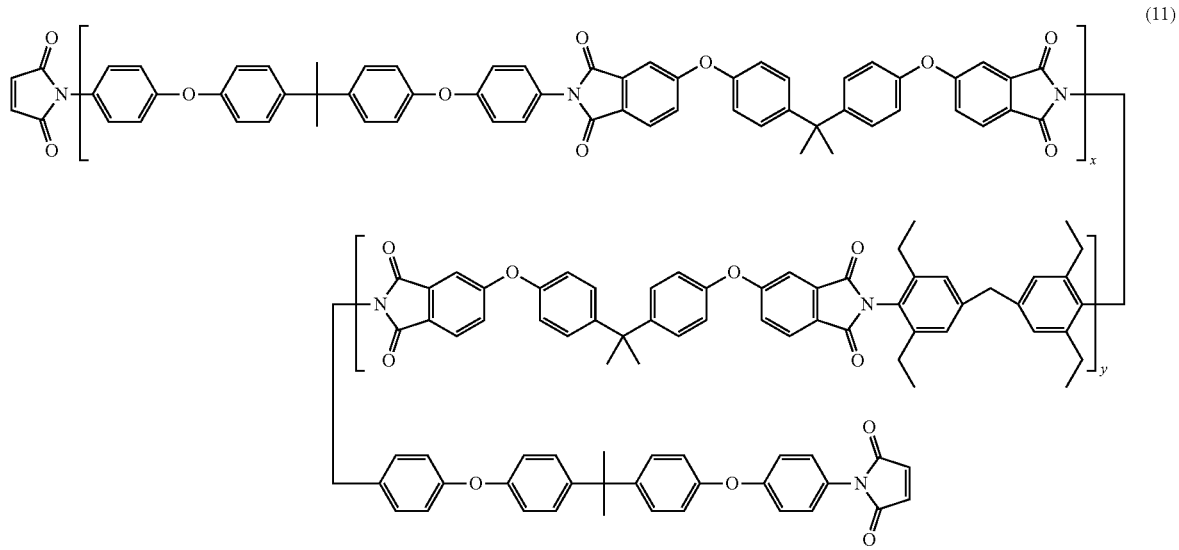

(11)

In the formula (11), the value of x is 10 to 35.
In the formula (11), the value of y is 10 to 35.

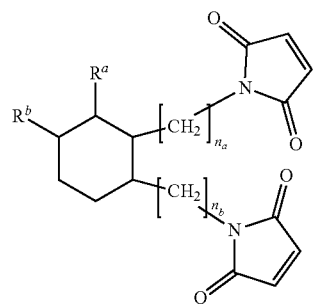

(12)

In the formula (12), $R^a$ represents a linear or branched alkyl group having 1 to 16 carbon atoms, or a linear or branched alkenyl group having 1 to 16 carbon atoms. $R^a$ is preferably a linear or branched alkyl group, and more preferably a linear alkyl group because excellent photocurability is exhibited.

The number of carbon atoms in the alkyl group is preferably 4 to 12 because excellent photocurability is exhibited.

The number of carbon atoms in the alkenyl group is preferably 4 to 12 because excellent photocurability is exhibited.

For the linear or branched alkyl group, the alkyl group in the formula (1) can be referred to. Among the above, since excellent photocurability is exhibited, a n-heptyl group, a n-octyl group, and a n-nonyl group are preferable, and a n-octyl group is more preferable.

For the linear or branched alkenyl group, the alkenyl group in the formula (1) can be referred to. Among the above, since excellent photocurability is exhibited, a 2-heptenyl group, a 2-octenyl group, and a 2-nonenyl group are preferable, and a 2-octenyl group is more preferable.

In the formula (12), $R^b$ represents a linear or branched alkyl group having 1 to 16 carbon atoms, or a linear or branched alkenyl group having 1 to 16 carbon atoms. $R^b$ is preferably a linear or branched alkyl group, and more preferably a linear alkyl group because excellent photocurability is exhibited.

The number of carbon atoms in the alkyl group is preferably 1 to 16, and more preferably 4 to 12 because excellent photocurability is exhibited.

The number of carbon atoms in the alkenyl group is preferably 1 to 16, and more preferably 4 to 12 because excellent photocurability is exhibited.

As specific examples of the alkyl group, the alkyl groups in $R^a$ described above can be referred to. Among the above, since excellent photocurability is exhibited, a n-heptyl group, a n-octyl group, and a n-nonyl group are preferable, and a n-octyl group is more preferable.

As specific examples of the alkenyl group, the alkenyl groups in $R^a$ described above can be referred to. Among the above, since excellent photocurability is exhibited, a 2-heptenyl group, a 2-octenyl group, and a 2-nonenyl group are preferable, and a 2-octenyl group is more preferable.

In the formula (12), the value of $n_a$ is 1 or more, preferably 2 to 16, and from the viewpoint of exhibiting excellent photocurability, more preferably 3 to 14.

In the formula (12), the value of $n_b$ is 1 or more, preferably 2 to 16, and from the viewpoint of exhibiting excellent photocurability, more preferably 3 to 14.

The values of $n_a$ and $n_b$ may be the same, or may be different.

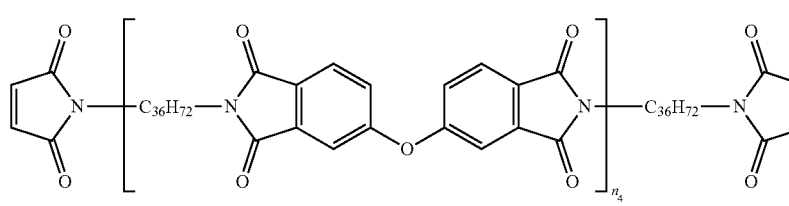

(13)

In the formula (13), $n_4$ (average) is 0.5 or more, preferably 0.8 to 10, and from the viewpoint of exhibiting excellent photocurability, more preferably 1 to 8.

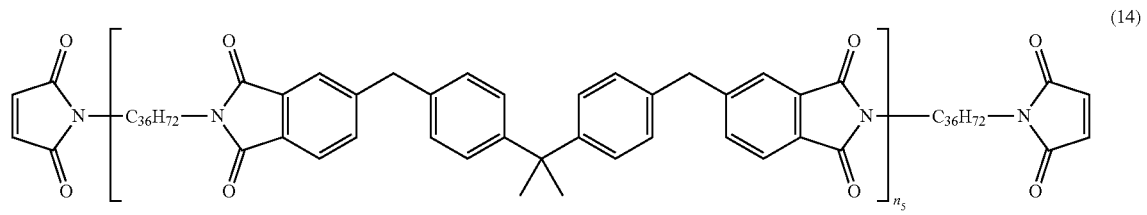

(14)

In the formula (14), $n_5$ represents an integer of 1 or more and preferably represents an integer of 1 to 10.

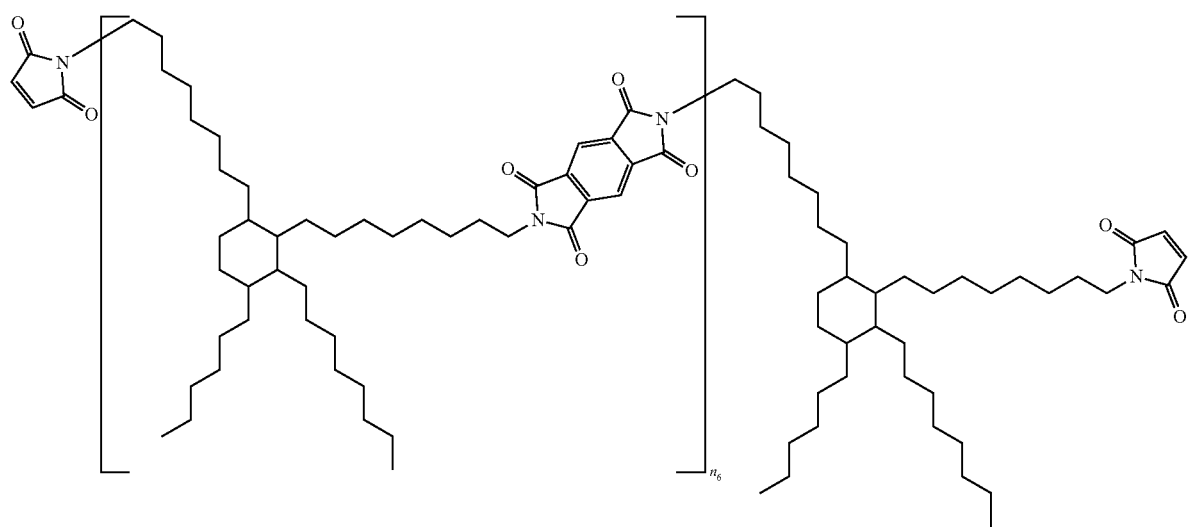

(15)

In the formula (15), $n_6$ represents an integer of 1 or more and preferably represents an integer of 1 to 10.

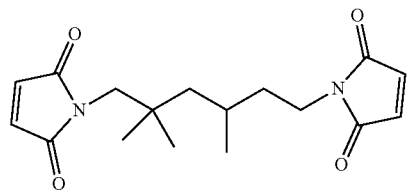

(16)

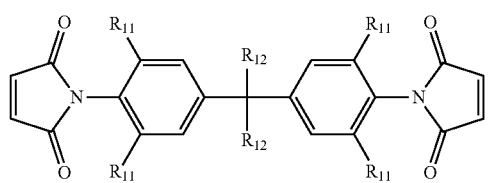

(17)

In the above formula (17), each $R_{11}$ independently represents a hydrogen atom, a methyl group, or an ethyl group, and each $R_{12}$ independently represents a hydrogen atom or a methyl group.

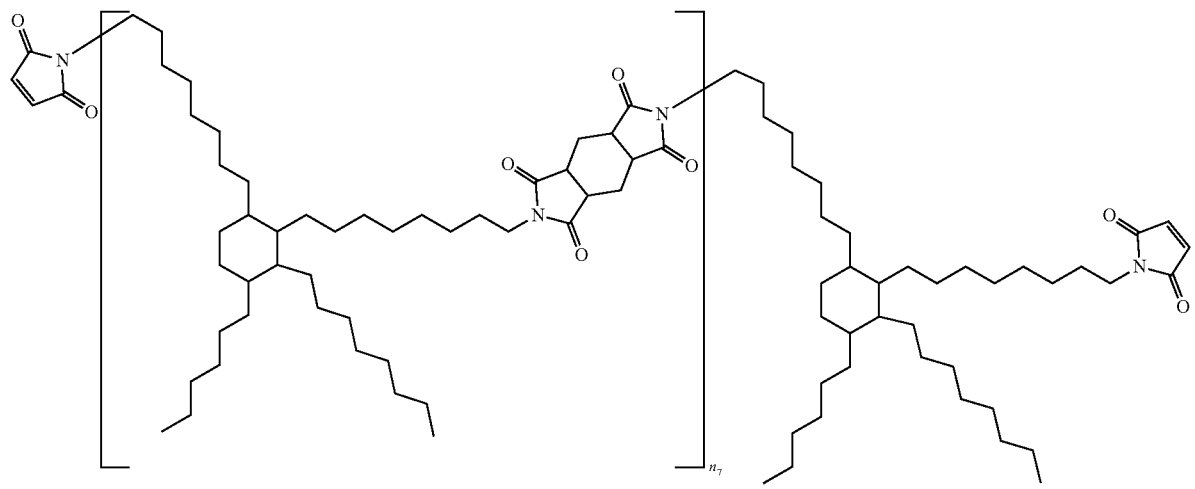

(18)

In the formula (18), $n_7$ represents an integer of 1 to 10. $n_7$ is preferably an integer of 1 to 6 because a more suitable viscosity can be obtained and an increase in viscosity of varnish can be more reliably controlled.

As the other maleimide compound, commercial products can also be used.

Examples of the maleimide compound represented by the formula (8) include BMI-2300 (manufactured by Daiwakasei Industry Co., LTD., product name).

Examples of the maleimide compound represented by the formula (9) include MIR-3000 (manufactured by Nippon Kayaku Co., Ltd., product name).

Examples of the maleimide compound represented by the formula (10) include BMI-1000P (product name, $n_3$=13.6 (average) in the formula (10)) manufactured by K.I Chemical Industry Co., LTD., BMI-650P (product name, $n_3$=8.8 (average) in the formula (10)) manufactured by K.I Chemical Industry Co., LTD., BMI-250P (product name, $n_3$=3 to 8 (average) in the formula (10)) manufactured by K.I Chemical Industry Co., LTD., and CUA-4 (product name, $n_3$=1 in the formula (10)) manufactured by K.I Chemical Industry Co., LTD.

Examples of the maleimide compound represented by the formula (11) include BMI-6100 (product name, x=18 and y=18 in the formula (11)) manufactured by Designer Molecules Inc. (DMI).

Examples of the maleimide compound represented by the formula (12) include BMI-689 (product name, the formula (19), functional group equivalent: 346 g/eq.) manufactured by Designer Molecules Inc. (DMI).

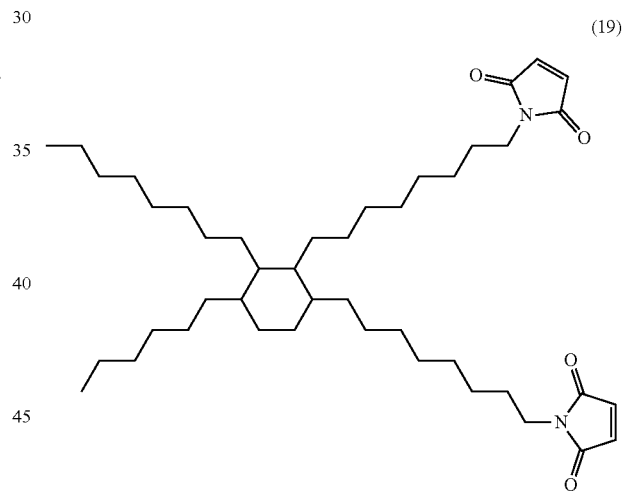

(19)

Examples of the maleimide compound represented by the formula (13) include BMI-1500 (product name, $n_4$=1.3 in the formula (13), functional group equivalent: 754 g/eq.) manufactured by Designer Molecules Inc. (DMI).

As the maleimide compound represented by the formula (14), commercial products can also be used. Examples thereof include BMI-1700 (product name) manufactured by Designer Molecules Inc (DMI).

As the maleimide compound represented by the formula (15), commercial products can also be used, and examples thereof include BMI-3000 (product name) manufactured by Designer Molecules Inc. (DMI), BMI-3000J (product name) manufactured by Designer Molecules Inc. (DMI), BMI-5000 (product name) manufactured by Designer Molecules Inc. (DMI), and BMI-9000 (product name) manufactured by Designer Molecules Inc. (DMI).

As the maleimide compound represented by the formula (16), commercial products can also be used. Examples thereof include BMI-TMH (product name) manufactured by Daiwakasei Industry Co., LTD.

As the maleimide compound represented by the formula (17), commercial products can also be used. Examples thereof include BMI-70 (product name) manufactured by K.I Chemical Industry Co., LTD.

As the maleimide compound including the maleimide compound represented by the formula (18), commercial products can also be used. Examples thereof include MIZ-001 (product name) manufactured by Nippon Kayaku Co., Ltd.

One of these other maleimide compounds can be used, or two or more thereof can be appropriately mixed and used.

In the resin composition, the total content of the other maleimide compound is not particularly limited, but is preferably 0.01 to 95 parts by mass, more preferably 5 to 90 parts by mass, yet more preferably 15 to 85 parts by mass, even yet more preferably 17 to 80 parts by mass, still even yet more preferably 20 to 45 parts by mass, and particularly preferably 20 to 30 parts by mass based on 100 parts by mass of the resin solid content in the resin composition from the viewpoint of obtaining a superior photocurability, heat resistance, and thermal stability.

(Cyanate Compound)

The cyanate compound is not particularly limited as long as it is a resin having in the molecule an aromatic moiety substituted by at least one cyanate group (cyanate group).

For example, mention may be made of those represented by the formula (20).

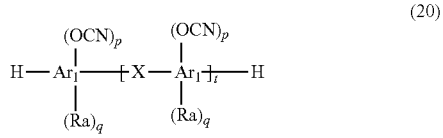

(20)

In the formula (20), $Ar_1$ represents a benzene ring, a naphthalene ring, or two benzene rings bonded to each other by a single bond. When there are a plurality of $Ar_1$, $Ar_1$ may be the same as or different from each other. Each Ra independently represents a hydrogen atom, an alkyl group having 1 to 6 carbon atoms, an alkenyl group having 2 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra. p represents the number of cyanate groups bonded to $Ar_1$ and is each independently an integer of 1 to 3. q represents the number of Ra bonded to $Ar_1$ and is 4-p when $Ar_1$ is a benzene ring, 6-p when $Ar_1$ is a naphthalene ring, and 8-p when $Ar_1$ is two benzene rings bonded to each other by a single bond. t represents the average number of repetitions and is an integer of 0 to 50, and the cyanate compound may be a mixture of compounds having different t. X represents any of a single bond, a divalent organic group having 1 to 50 carbon atoms (a hydrogen atom may be substituted by a heteroatom), a divalent organic group having 1 to 10 nitrogen atoms (for example, —N—R—N— (wherein R represents an organic group)), a carbonyl group (—CO—), a carboxy group (—C(═O)O—), a carbonyl dioxide group (—OC(═O)O—), a sulfonyl group (—SO$_2$—), a divalent sulfur atom, and a divalent oxygen atom, and X is each independently as defined above when there are a plurality of X.

The alkyl group for Ra in the formula (20) may have either a linear or branched chain structure or a cyclic structure (for example, a cycloalkyl group).

In addition, a hydrogen atom in the alkyl group and the aryl group for Ra in the formula (20) may be replaced by a halogen atom such as a fluorine atom or a chlorine atom; an alkoxyl group such as a methoxy group or a phenoxy group; a cyano group, or the like.

Specific examples of the alkyl group include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the alkenyl group include a vinyl group, a (meth)allyl group, an isopropenyl group, a 1-propenyl group, a 2-butenyl group, a 3-butenyl group, a 1,3-butanedienyl group, 2-methyl-2-propenyl, a 2-pentenyl group, and a 2-hexenyl group.

Specific examples of the aryl group include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group.

Examples of the alkoxyl group include a methoxy group, an ethoxy group, a propoxy group, an isopropoxy group, a n-butoxy group, an isobutoxy group, and a tert-butoxy group.

Specific examples of the divalent organic group having 1 to 50 carbon atoms for X in the formula (20) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the above divalent organic group may be replaced by a halogen atom such as a fluorine atom or a chlorine atom; an alkoxyl group such as a methoxy group or a phenoxy group; a cyano group, or the like.

Examples of the divalent organic group having 1 to 10 nitrogen atoms for X in the formula (20) include an imino group and a polyimide group.

In addition, examples of the organic group of X in the formula (20) include one having a structure represented by the formula (21) or the formula (22).

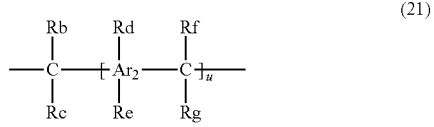

(21)

In the formula (21), $Ar_2$ represents a benzenediyl group, a naphthalenediyl group, or a biphenyldiyl group, and may be the same as or different from each other when u is an integer of 2 or more. Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group. Rd and Re are each independently selected from any one of a hydrogen atom, an alkyl group having 1 to 6 carbon atoms, an aryl group having 6 to 12 carbon atoms, an alkoxyl group having 1 to 4 carbon atoms, and a hydroxy group. u represents an integer of 0 to 5.

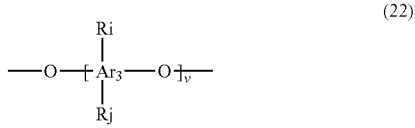
(22)

In the formula (22), $Ar_a$ represents a benzenediyl group, a naphthalenediyl group, or a biphenyldiyl group, and may be the same as or different from each other when v is an integer of 2 or more. Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanate group. v represents an integer of 0 to 5, and the cyanate compound may be a mixture of compounds having different v.

Furthermore, examples of X in the formula (20) include divalent groups represented by the following formulas.

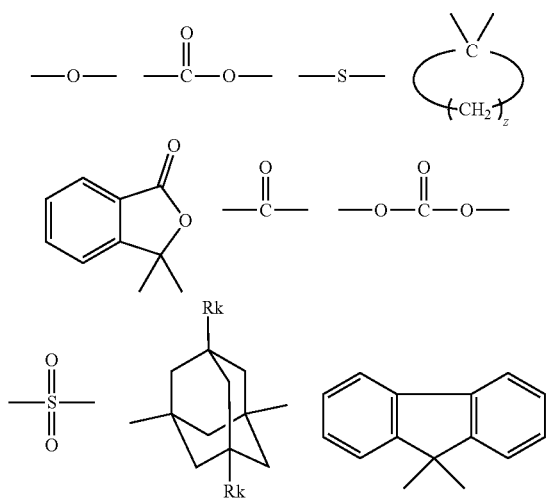

Here, in the above formula, z represents an integer of 4 to 7. Each Rk independently represents a hydrogen atom or an alkyl group having 1 to 6 carbon atoms.

Specific examples of $Ar_e$ in the formula (21) and $Ar_a$ in the formula (22) include a benzenediyl group to which two carbon atoms shown in the formula (21) or two oxygen atoms shown in the formula (21) are bonded at positions 1 and 4 or positions 1 and 3, a biphenyldiyl group to which the above two carbon atoms or two oxygen atoms are bonded at positions 4 and 4', positions 2 and 4', positions 2 and 2', positions 2 and 3', positions 3 and 3', or positions 3 and 4', and a naphthalenediyl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in the formula (21) and Ri and Rj in the formula (22) have the same meanings as those in the above formula (20).

Specific examples of the cyanate-substituted aromatic compound represented by the above formula (20) include cyanatebenzene, 1-cyanate-2-, 1-cyanate-3-, or 1-cyanate-4-methylbenzene, 1-cyanate-2-, 1-cyanate-3-, or 1-cyanate-4-methoxybenzene, 1-cyanate-2,3-, 1-cyanate-2,4-, 1-cyanate-2,5-, 1-cyanate-2,6-, 1-cyanate-3,4-, or 1-cyanate-3,5-dimethylbenzene, cyanateethylbenzene, cyanatebutylbenzene, cyanateoctylbenzene, cyanatenonylbenzene, 2 (4 cyanatephenyl)-2-phenylpropane (a cyanate of 4-α-cumylphenol), 1-cyanate-4-cyclohexylbenzene, 1-cyanate-4-vinylbenzene, 1-cyanate-2- or 1-cyanate-3-chlorobenzene, 1-cyanate-2,6-dichlorobenzene, 1-cyanate-2-methyl-3-chlorobenzene, cyanatenitrobenzene, 1-cyanate-4-nitro-2-ethylbenzene, 1-cyanate-2-methoxy-4-allylbenzene (a cyanate of eugenol), methyl(4-cyanatephenyl)sulfide, 1-cyanate-3-trifluoromethylbenzene, 4-cyanatebiphenyl, 1-cyanate-2- or 1-cyanate-4-acetylbenzene, 4-cyanatebenzaldehyde, methyl 4-cyanatebenzoate ester, phenyl 4-cyanatebenzoate ester, 1-cyanate-4-acetaminobenzene, 4-cyanatebenzophenone, 1-cyanate-2,6-di-tert-butylbenzene, 1,2-dicyanatebenzene, 1,3-dicyanatebenzene, 1,4-dicyanatebenzene, 1,4-dicyanate-2-tert-butylbenzene, 1,4-dicyanate-2,4-dimethylbenzene, 1,4-dicyanate-2,3,4-dimethylbenzene, 1,3-dicyanate-2,4,6-trimethylbenzene, 1,3-dicyanate-5-methylbenzene, 1-cyanate- or 2-cyanatenaphthalene, 1-cyanate-4-methoxynaphthalene, 2-cyanate-6-methoxynaphthalene, 2-cyanate-7-methoxynaphthalene, 2,2'-dicyanate-1,1'-binaphthyl, 1,3-, 1,4-, 1,5-, 1,6-, 1,7-, 2,3-, 2,6-, or 2,7-dicyanatenaphthalene, 2,2'-or 4,4'-dicyanatebiphenyl, 4,4'-dicyanateoctafluorobiphenyl, 2,4'- or 4,4'-dicyanatediphenylmethane, bis(4-cyanate-3,5-dimethylphenyl)methane, 1,1-bis(4-cyanatephenyl)ethane, 1,1-bis(4-cyanatephenyl)propane, 2,2-bis(4-cyanatephenyl)propane, 2,2-bis(4-cyanate-3-methylphenyl)propane, 2,2-bis(2-cyanate-5-biphenylyl)propane, 2,2-bis(4-cyanatephenyl)hexafluoropropane, 2,2-bis(4-cyanate-3,5-dimethylphenyl)propane, 1,1-bis(4-cyanatephenyl)butane, 1,1-bis(4-cyanatephenyl)isobutane, 1,1-bis(4-cyanatephenyl)pentane, 1,1-bis(4-cyanatephenyl)-3-methylbutane, 1,1-bis(4-cyanatephenyl)-2-methylbutane, 1,1-bis(4-cyanatephenyl)-2,2-dimethylpropane, 2,2-bis(4-cyanatephenyl)butane, 2,2-bis(4-cyanatephenyl)pentane, 2,2-bis(4-cyanatephenyl)hexane, 2,2-bis(4-cyanatephenyl)-3-methylbutane, 2,2-bis(4-cyanatephenyl)-4-methylpentane, 2,2-bis(4-cyanatephenyl)-3,3-dimethylbutane, 3,3-bis(4-cyanatephenyl)hexane, 3,3-bis(4-cyanatephenyl)heptane, 3,3-bis(4-cyanatephenyl)octane, 3,3-bis(4-cyanatephenyl)-2-methylpentane, 3,3-bis(4-cyanatephenyl)-2-methylhexane, 3,3-bis(4-cyanatephenyl)-2,2-dimethylpentane, 4,4-bis(4-cyanatephenyl)-3-methylheptane, 3,3-bis(4-cyanatephenyl)-2-methylheptane, 3,3-bis(4-cyanatephenyl)-2,2-dimethylhexane, 3,3-bis(4-cyanatephenyl)-2,4-dimethylhexane, 3,3-bis(4-cyanatephenyl)-2,2,4-trimethylpentane, 2,2-bis(4-cyanatephenyl)-1,1,1,3,3,3-hexafluoropropane, bis(4-cyanatephenyl)phenylmethane, 1,1-bis(4-cyanatephenyl)-1-phenylethane, bis(4-cyanatephenyl)biphenylmethane, 1,1-bis(4-cyanatephenyl)cyclopentane, 1,1-bis(4-cyanatephenyl)cyclohexane, 2,2-bis(4-cyanate-3-isopropylphenyl)propane, 1,1-bis(3-cyclohexyl-4-cyanatephenyl)cyclohexane, bis(4-cyanatephenyl)diphenylmethane, bis(4-cyanatephenyl)-2,2-dichloroethylene, 1,3-bis[2-(4-cyanatephenyl)-2-propyl]benzene, 1,4-bis[2-(4-cyanatephenyl)-2-propyl]benzene, 1,1-bis(4-cyanatephenyl)-3,3,5-trimethylcyclohexane, 4-[bis(4-cyanatephenyl)methyl]biphenyl, 4,4-dicyanatebenzophenone, 1,3-bis(4-cyanatephenyl)-2-propen-1-one, bis (4-cyanatephenyl) ether, bis(4-cyanatephenyl) sulfide, bis(4-cyanatephenyl) sulfone, 4-cyanatebenzoic acid-4-cyanatephenyl ester (4-cyanatephenyl-4-cyanatebenzoate), bis-(4-cyanatephenyl) carbonate, 1,3-bis(4-cyanatephenyl) adamantane, 1,3-bis(4-cyanatephenyl)-5,7-dimethyladamantane, 3,3-bis(4-cyanatephenyl)isobenzofuran-1(3H)-one (a cyanate of phenolphthalein), 3,3-bis(-cyanate-3-methylphenyl)isobenzofuran-1(3H)-one (a cyanate of o-cresolphthalein), 9,9'-bis(4-cyanatephenyl)fluorene, 9,9-bis(-cyanate-3-methylphenyl)fluorene, 9,9-bis(2-cyanate-5-biphenylyl)fluorene, tris(4-cyanatephenyl)methane, 1,1,1-tris(4-cyanatephenyl)ethane, 1,1,3-tris(4-cyanatephenyl) propane, α,α,α'-tris(4-cyanatephenyl)-1-ethyl-4-isopropylbenzene, 1,1,2,2-tetrakis(4-cyanatephenyl)ethane, tetrakis(4-cyanatephenyl)methane, 2,4,6-tris(N-methyl-4-cyanateanilino)-1,3,5-triazine, 2,4-bis(N-methyl-4-cyanateanilino)-6-(N-methylanilino)-1,3,5-triazine, bis(N-4-cyanate-2-methylphenyl)-4,4'-oxydiphthalimide, bis(N-3-cyanate-4-methylphenyl)-4,4'-oxydiphthalimide, bis(N-4-cyanatephenyl)-4,4'-oxydiphthalimide, bis(N-4-cyanate-2-methylphenyl)-4,4'-(hexafluoroisopropylidene) diphthalimide, tris(3,5-dimethyl-4-cyanatebenzyl) isocyanurate, 2-phenyl-3,3-bis(4-cyanatephenyl)phthalimidine, 2-(4-methylphenyl)-3,3-bis(4-cyanatephenyl)phthalimidine, 2-phenyl-3,3-bis(4-cyanate-3-methylphenyl) phthalimidine, 1-methyl-3,3-bis(4-cyanatephenyl)indolin-2-one, and 2-phenyl-3,3-bis(4-cyanatephenyl)indolin-2-one.

One of these cyanate compounds can be used, or two or more thereof can be appropriately mixed and used.

Other specific examples of the cyanate compound represented by the formula (20) include those obtained by cyanation of a phenolic resin such as a phenol novolac resin and a cresol novolac resin (those obtained by reacting phenol, an alkyl-substituted phenol or a halogen-substituted phenol with a formaldehyde compound such as formalin or paraformaldehyde in an acidic solution, using a publicly known method), a trisphenol novolac resin (those obtained by reacting hydroxybenzaldehyde with phenol in the presence of an acidic catalyst), a fluorene novolac resin (those obtained by reacting a fluorenone compound with a 9,9-bis (hydroxyaryl)fluorene in the presence of an acidic catalyst), a phenol aralkyl resin, a cresol aralkyl resin, a naphthol aralkyl resin, and a biphenyl aralkyl resin (those obtained by reacting a bishalogenomethyl compound as represented by $Ar_4$—$(CH_2Y)_2$ (wherein $Ar_4$ represents a phenyl group and Y represents a halogen atom. The same applies in this paragraph.) with a phenolic compound with an acidic catalyst or with no catalyst, those obtained by reacting a bis (alkoxymethyl) compound as represented by $Ar_4$—$(CH_2OR)_2$ (wherein R represents an alkyl group) with a phenolic compound in the presence of an acidic catalyst, or those obtained by reacting a bis(hydroxymethyl) compound as represented by $Ar_4$—$(CH_2OH)_2$ with a phenolic compound in the presence of an acidic catalyst, or those obtained by polycondensing an aromatic aldehyde compound, an aralkyl compound, and a phenolic compound, using a publicly known method), a phenol-modified xylene formaldehyde resin (those obtained by reacting a xylene formaldehyde resin with a phenolic compound in the presence of an acidic catalyst, using a publicly known method), a modified naphthalene formaldehyde resin (those obtained by reacting a naphthalene formaldehyde resin with a hydroxy-substituted aromatic compound in the presence of an acidic catalyst, using a publicly known method), a phenol-modified dicyclopentadiene resin, and a phenolic resin having a polynaphthylene ether structure (those obtained by subjecting a polyvalent hydroxynaphthalene compound having two or more phenolic hydroxy groups in one molecule to dehydration condensation in the presence of a basic catalyst, using a publicly known method) by a method similar to the above, and a prepolymer thereof. One of these cyanate compounds can be used, or two or more thereof can be appropriately mixed and used.

The method for producing these cyanate compounds is not particularly limited, and a publicly known method can be used. Examples of such a production method include acquisition or synthesis of a hydroxy group containing compound having a desired skeleton and cyanation of that compound by modifying the hydroxy group by a publicly known method. Examples of the approach for the cyanation of hydroxy groups include the approach described in Ian Hamerton, "Chemistry and Technology of Cyanate Ester Resins," Blackie Academic & Professional.

The cured product using these cyanate compounds has a property of being excellent in glass transition temperature, a low thermal expansion property, plating adhesiveness, and the like.

In the resin composition, the total content of the cyanate compound is preferably 0.01 to 40 parts by mass based on 100 parts by mass of the resin solid content in the resin composition.

(Phenolic Resin)

As the phenolic resin, those publicly known in general can be used as long as they are phenolic resins having two or more hydroxyl groups in one molecule. Examples thereof include a bisphenol A-based phenolic resin, a bisphenol E-based phenolic resin, a bisphenol F-based phenolic resin, a bisphenol S-based phenolic resin, a phenol novolac resin, a bisphenol A novolac-based phenolic resin, a glycidyl ester-based phenolic resin, an aralkyl novolac-based phenolic resin, a biphenyl aralkyl-based phenolic resin, a cresol novolac-based phenolic resin, a polyfunctional phenolic resin, a naphthol resin, a naphthol novolac resin, a polyfunctional naphthol resin, an anthracene-based phenolic resin, a naphthalene skeleton modified novolac-based phenolic resin, a phenol aralkyl-based phenolic resin, a naphthol aralkyl-based phenolic resin, a dicyclopentadiene-based phenolic resin, a biphenyl-based phenolic resin, an alicyclic phenolic resin, a polyol-based phenolic resin, a phosphorus containing phenolic resin, a polymerizable unsaturated hydrocarbon group containing phenolic resin, and a hydroxyl group containing silicone resin. One of these phenol resins can be used, or two or more thereof can be appropriately mixed and used.

In the resin composition, the total content of the phenolic resin is preferably 0.01 to 40 parts by mass based on 100 parts by mass of the resin solid content in the resin composition.

(Epoxy Resin)

There is no particular limitation on the epoxy resin, and those publicly known in general can be used. Examples thereof include a bisphenol A-based epoxy resin, a bisphenol E-based epoxy resin, a bisphenol F-based epoxy resin, a bisphenol S-based epoxy resin, a bisphenol A novolac-based epoxy resin, a biphenyl-based epoxy resin, a phenol novolac-based epoxy resin, a cresol novolac-based epoxy resin, a xylene novolac-based epoxy resin, a polyfunctional phenol-based epoxy resin, a naphthalene-based epoxy resin, a naphthalene skeleton modified novolac-based epoxy resin, a naphthylene ether-based epoxy resin, a phenol aralkyl-based epoxy resin, an anthracene-based epoxy resin, a trifunctional phenol-based epoxy resin, a tetrafunctional phenol-based epoxy resin, triglycidyl isocyanurate, a glycidyl ester-based epoxy resin, an alicyclic epoxy resin, a dicyclopentadiene novolac-based epoxy resin, a biphenyl novolac-based epoxy resin, a phenol aralkyl novolac-based epoxy resin, a naphthol aralkyl novolac-based epoxy resin, an aralkyl novolac-based epoxy resin, a naphthol aralkyl-based epoxy resin, a dicyclopentadiene-based epoxy resin, a polyol-based epoxy resin, a phosphorus containing epoxy resin, a glycidyl amine, a compound obtained by epoxidizing a double bond of butadiene and the like, a compound obtained by the reaction between a hydroxyl group containing silicone resin and epichlorohydrin, and a halide thereof. One of these epoxy resins can be used, or two or more thereof can be appropriately mixed and used.

As the epoxy resin, commercial products can be used, and examples thereof include an epoxy resin represented by the formula (23) (NC-3000FH (product name) manufactured by Nippon Kayaku Co., Ltd., $n_g$ is about 4 in the formula (23)) and a naphthalene-based epoxy resin represented by the formula (24) (HP-4710 (product name) manufactured by DIC CORPORATION).

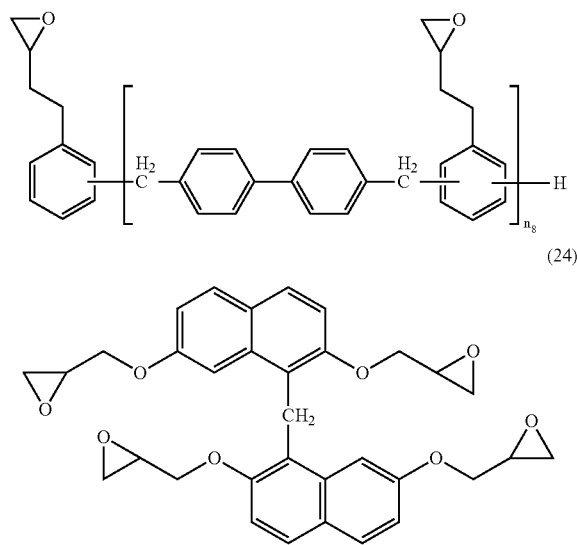

(23)

(24)

One of these epoxy resins can be used, or two or more thereof can be appropriately mixed and used.

In the resin composition, the total content of the epoxy resin is preferably 0.01 to 40 parts by mass based on 100 parts by mass of the resin solid content in the resin composition.

(Oxetane Resin) As the oxetane resin, those publicly known in general can be used. Examples thereof include, but are not limited to, oxetane, an alkyloxetane such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluorooxetane, 2-chloromethyloxetane, 3,3-bis(chloromethyl)oxetane, biphenyl-based oxetane, OXT-101 (manufactured by Toagosei Co., Ltd., product name), OXT-121 (manufactured by Toagosei Co., Ltd., product name), and OXT-221 (manufactured by Toagosei Co., Ltd., product name). One of these oxetane resins can be used, or two or more thereof can be appropriately mixed and used.

In the resin composition, the total content of the oxetane resin is preferably 0.01 to 40 parts by mass based on 100 parts by mass of the resin solid content in the resin composition.

(Benzoxazine Compound)
As the benzoxazine compound, for example, those publicly known in general can be used as long as they are compounds having two or more dihydrobenzoxazine rings in one molecule. Examples thereof include a bisphenol A-based benzoxazine BA-BXZ (manufactured by Konishi Chemical Ind. Co., Ltd., product name), a bisphenol F-based benzoxazine BF-BXZ (manufactured by Konishi Chemical Ind. Co., Ltd., product name), a bisphenol S-based benzoxazine BS-BXZ (manufactured by Konishi Chemical Ind. Co., Ltd., product name), and a phenolphthalein-based benzoxazine. One of these benzoxazine compounds can be used, or two or more thereof can be appropriately mixed and used.

In the resin composition, the total content of the benzoxazine compound is preferably 0.01 to 40 parts by mass based on 100 parts by mass of the resin solid content in the resin composition.

(Carbodiimide Compound)
The carbodiimide compound is not particularly limited as long as it has at least one or more carbodiimide groups in the molecule, and those publicly known in general can be used. Examples thereof include polycarbodiimides such as dicyclohexyl carbodiimide, diisopropyl carbodiimide, dimethyl carbodiimide, diisobutyl carbodiimide, dioctyl carbodiimide, t-butyl isopropyl carbodiimide, diphenyl carbodiimide, di-t-butyl carbodiimide, di-β-naphthyl carbodiimide, N,N'-di-2,6-diisopropylphenyl carbodiimide, 2,6,2',6'-tetraisopropyldiphenyl carbodiimide, cyclic carbodiimide, Carbodilite (registered trademark: manufactured by Nisshinbo Chemical Inc.), and Stabaxol (registered trademark: manufactured by LANXESS Deutschland GmbH). One of these carbodiimide compounds can be used, or two or more thereof can be appropriately mixed and used.

In the resin composition, the total content of the carbodiimide compound is preferably 0.01 to 40 parts by mass based on 100 parts by mass of the resin solid content in the resin composition.

(Compound Having Ethylenically Unsaturated Group)
The compound having an ethylenically unsaturated group is not particularly limited as long as it is a compound having one or more ethylenically unsaturated groups in one molecule, and those publicly known in general can be used. Examples thereof include compounds having a (meth)acryloyl group, a vinyl group, and the like.

Examples of the compound having a (meth)acryloyl group include methyl (meth)acrylate, ethyl (meth)acrylate, butyl (meth)acrylate, lauryl (meth) acrylate, polyethylene glycol (meth)acrylate, polyethylene glycol (meth)acrylate monomethylether, phenylethyl (meth)acrylate, isobornyl (meth)acrylate, cyclohexyl (meth)acrylate, benzyl (meth) acrylate, tetrahydrofurfuryl (meth)acrylate, butanediol di(meth)acrylate, hexanediol di(meth)acrylate, neopentyl glycol di(meth)acrylate, nonanediol di(meth)acrylate, glycol di(meth)acrylate, diethylene di(meth)acrylate, polyethylene glycol di(meth)acrylate, tris(meth)acryloyloxyethyl isocyanurate, polypropylene glycol di(meth)acrylate, adipic acid epoxy di(meth)acrylate, bisphenol ethyleneoxide di(meth) acrylate, hydrogenated bisphenol ethyleneoxide (meth)acrylate, bisphenol di(meth)acrylate, ε-caprolactone-modified hydroxypivalic acid neopentylglycol di(meth)acrylate, ε-caprolactone-modified dipentaerythritol hexa(meth)acrylate, ε-caprolactone-modified dipentaerythritol poly(meth) acrylate, dipentaerythritol poly(meth)acrylate, trimethylolpropane tri(meth)acrylate, triethylolpropane tri(meth) acrylate, and ethyleneoxide adducts thereof; pentaerythritol tri(meth)acrylate and ethyleneoxide adducts thereof; and pentaerythritol tetra(meth)acrylate, dipentaerythritol hexa (meth)acrylate and ethyleneoxide adducts thereof.

Further, other examples thereof also include urethane (meth)acrylates having both a (meth)acryloyl group and a urethane bond in the same molecule; polyester (meth)acrylates having both a (meth)acryloyl group and an ester bond in the same molecule; epoxy (meth)acrylates derived from an epoxy resin and having both a (meth)acryloyl group; and reactive oligomers in which these bonds are used in combination.

Examples of the urethane (meth)acrylate include a reaction product of a hydroxyl group-containing (meth)acrylate with a polyisocyanate and other alcohols used if required. Examples thereof include urethane (meth)acrylates obtained by reacting hydroxyalkyl (meth)acrylates such as hydroxyethyl (meth)acrylate, hydroxypropyl (meth)acrylate, and hydroxybutyl (meth)acrylate; glycerin (meth)acrylates such as glycerin mono(meth)acrylate and glycerin di(meth)acrylate; sugar alcohol (meth)acrylates such as pentaerythritol di(meth)acrylate, pentaerythritol tri(meth)acrylate, dipentaerythritol penta(meth)acrylate, and dipentaerythritol hexa (meth)acrylate; and polyisocyanates such as toluene diisocyanate, hexamethylene diisocyanate, trimethylhexamethylene diisocyanate, isophorone diisocyanate, norbornene diisocyanate, xylene diisocyanate, hydrogenated xylene diisocyanate, dicyclohexane methylene diisocyanate, and isocyanurates and biurets thereof.

Examples of the polyester (meth)acrylates include monofunctional (poly)ester (meth)acrylates such as caprolactone-modified 2-hydroxyethyl (meth)acrylate, ethylene oxide- and/or propylene oxide-modified phthalic acid (meth)acrylate, ethylene oxide-modified succinic acid (meth)acrylate, and caprolactone-modified tetrahydrofurfuryl (meth)acrylate; di(poly)ester (meth)acrylates such as hydroxypivalic acid ester neopentyl glycol di(meth)acrylate, caprolactone-modified hydroxypivalic acid ester neopentyl glycol di(meth)acrylate, and epichlorohydrin-modified phthalic acid di(meth)acrylate; and mono-, di-, or tri(meth)acrylates of triols obtained by adding one or more moles of cyclic lactone compounds such as ε-caprolactone, γ-butyrolactone, and δ-valerolactone to one mole of trimethylolpropane or glycerin.

Examples thereof include mono-, di-, tri- or tetra(meth)acrylates of triols obtained by adding one mol or more of cyclic lactone compounds such as ε-caprolactone, γ-butyrolactone and δ-valerolactone to one mol of pentaerythritol, dimethylolpropane, trimethylolpropane, or tetramethylolpropane, and mono(meth)acrylates or poly(meth)acrylates of polyhydric alcohols such as triols, tetraols, pentaols or hexaols of mono-, or poly(meth)acrylates of triols obtained by adding one mol or more of cyclic lactone compounds such as ε-caprolactone, γ-butyrolactone and δ-valerolactone to one mole of dipentaerythritol.

Examples thereof further include (meth)acrylates of polyester polyols obtained by reacting a diol component such as (poly)ethylene glycol, (poly)propylene glycol, (poly)tetramethylene glycol, (poly)butylene glycol, 3-methyl-1,5-pentanediol, and hexanediol and a polybasic acid such as maleic acid, fumaric acid, succinic acid, adipic acid, phthalic acid, isophthalic acid, hexahydrophthalic acid, tetrahydrophthalic acid, dimer acid, sebacic acid, azelaic acid, and 5-sodium sulfoisophthalic acid and anhydrides thereof; and polyfunctional (poly)ester(meth)acrylates such as (meth)acrylates of cyclic lactone-modified polyester diols containing a diol component, a polybasic acid and an anhydride thereof and ε-caprolactone, γ-butyrolactone and δ-valerolactone.

The epoxy (meth)acrylate is a carboxylate compound of a compound having an epoxy group and (meth)acrylic acid. Examples thereof include phenol novolac-based epoxy (meth)acrylate, cresol novolac-based epoxy (meth)acrylate, trishydroxyphenylmethane-based epoxy (meth)acrylate, dicyclopentadienephenol-based epoxy (meth)acrylate, bisphenol A-based epoxy (meth)acrylate, bisphenol F-based epoxy (meth)acrylate, biphenol-based epoxy (meth)acrylate, bisphenol A novolac-based epoxy (meth)acrylate, naphthalene skeleton-containing epoxy (meth)acrylate, glyoxal-based epoxy (meth)acrylate, heterocyclic epoxy (meth)acrylate, and acid anhydride-modified epoxy acrylates thereof.

Examples of the compound having a vinyl group include a vinyl ether such as ethyl vinyl ether, propyl vinyl ether, hydroxyethyl vinyl ether, and ethylene glycol divinyl ether. Examples of the styrene include styrene, methylstyrene, ethylstyrene, and divinylbenzene. Examples of other vinyl compounds include triallyl isocyanurate, trimethallyl isocyanurate, and bisallylnadiimide.

One of these compounds having an ethylenically unsaturated group can be used, or two or more thereof can be appropriately mixed and used.

In the resin composition, the total content of the compound having an ethylenically unsaturated group is preferably 0.01 to 40 parts by mass based on 100 parts by mass of the resin solid content in the resin composition.

[Filler]

In the resin composition, a filler can further be contained for improving a variety of characteristics such as a coating property and heat resistance. The filler preferably has an insulation property and does not inhibit transmissivity for a wavelength of 405 nm (h-line). Examples of the filler include silica (natural silica, fused silica, amorphous silica, hollow silica, etc.), an aluminum compound (boehmite, aluminum hydroxide, alumina, aluminum nitride, etc.), a boron compound (boron nitride, etc.), a magnesium compound (magnesium oxide, magnesium hydroxide, etc.), a calcium compound (calcium carbonate, etc.), a molybdenum compound (molybdenum oxide, zinc molybdate, etc.), a barium compound (barium sulfate, barium silicate, etc.), talc (natural talc, calcined talc, etc.), mica, glass (short fibrous glass, spherical glass, fine powder glass, E glass, T glass, D glass, etc.), silicone powder, a fluororesin-based filler, a urethane resin-based filler, a (meth)acrylic resin-based filler, a polyethylene-based filler, a styrene-butadiene rubber, and a silicone rubber. One of these fillers can be used, or two or more thereof can be appropriately mixed and used.

Among the above, silica, boehmite, barium sulfate, silicone powder, a fluororesin-based filler, a urethane resin-based filler, a (meth)acrylic resin-based filler, a polyethylene-based filler, a styrene-butadiene rubber and a silicone rubber are preferable.

These fillers may be surface-treated with a silane coupling agent, which will be mentioned later, or the like.

From the viewpoint of improving the heat resistance of the cured product and also obtaining a good coating property, silica is preferable and fused silica is more preferable. Specific examples of the silica include SFP-130MC (product name) manufactured by Denka Company Limited, and SC2050-MB (product name), SC1050-MLE (product name), YA010C-MFN (product name), and YA050C-MJA (product name) manufactured by Admatechs Company Limited.

The particle diameter of the filler, is normally 0.005 to 10 μm, and is preferably 0.01 to 1.0 μm from the viewpoint of ultraviolet light transmissivity of the resin composition.

In the resin composition, the content of the filler is preferably 300 parts by mass or less, more preferably 200 parts by mass or less, and still more preferably 100 parts by mass or less based on 100 parts by mass of the resin solid content in the resin composition, from the viewpoint of making the ultraviolet light transmissivity of the resin composition and the heat resistance of the cured product good. When the filler is contained, the lower limit value of its content is normally 1 part by mass or more based on 100 parts by mass of the resin solid content in the resin composition, from the viewpoint of obtaining effects of improving a variety of characteristics such as a coating property and heat resistance.

[Silane Coupling Agent and Wetting and Dispersing Agent]

In the resin composition, a silane coupling agent and/or a wetting and dispersing agent can also be used in combination in order to improve the dispersibility of the filler, as well as the adhesive strength between the polymers and/or the resins and the filler.

The silane coupling agent is not particularly limited as long as it is a silane coupling agent generally used for surface treatment of inorganic matters. Specific examples include aminosilane-based compounds such as 3-aminopropyltrimethoxysilane, 3-aminopropyltriethoxysilane, 3-aminopropyldimethoxysilane, 3-aminopropyldiethoxydiethoxysilane, N-(2-aminoethyl)-3-aminopropyltrimethoxysilane, N-(2-aminoethyl)-3-aminopropyltriethoxysilane, N-(2-aminoethyl)-3-aminopropyldimethoxymethylsilane, N-(2-aminoethyl)-3-aminopropyldiethoxymethylsilane, N-phenyl-3-aminopropyltrimethoxysilane, N-phenyl-3-aminopropyltriethoxysilane, [3-(6-aminohexylamino)propyl]trimethoxysilane and [3-(N,N-dimethylamino)propyl]trimethoxysilane; epoxysilane-based compounds such as 3-glycidoxypropyltrimethoxysilane, 3-glycidoxypropyltriethoxysilane, 3-glycidoxypropyldimethoxysilane, 3-glycidoxypropyldiethoxysilane, 2-(3,4-epoxycyclohexyl)ethyltrimethoxysilane and [8-(glycidyloxy)-n-octyl]trimethoxysilane; vinylsilane-based compounds such as vinyltris(2-methoxyethoxy)silane, vinyltrimethoxysilane, vinyltriethoxysilane, dimethoxymethylvinylsilane, diethoxymethylvinylsilane, trimethoxy(7-octen-1-yl)silane and trimethoxy(4-vinylphenyl)silane; methacrylic silane-based compounds such as 3-methacryloxypropyltrimethoxysilane, 3-methacryloxypropyltriethoxysilane, 3-methacryloxypropyldimethoxymethylsilane and 3-methacryloxypropyldimethoxymethylsilane; acrylic silane-based compounds such as 3-acryloxypropyltrimethoxysilane and 3-acryloxypropyltriethoxysilane; isocyanate silane-based compounds such as 3-isocyanatepropyltrimethoxysilane and 3-isocyanatepropyltriethoxysilane; isocyanurate silane-based compounds such as tris-(trimethoxysilylpropyl)isocyanurate; mercaptosilane-based compounds such as 3-mercaptopropyltrimethoxysilane and 3-mercaptopropyldimethoxymethylsilane; ureidosilane-based compounds such as 3-ureidopropyltriethoxysilane; styrylsilane-based compounds such as p-styryltrimethoxysilane; cationic silane-based compounds such as N-[2-(N-vinylbenzylamino)ethyl]-3-aminopropyltrimethoxysilane hydrochlorides; acid anhydride-based compounds such as [3-(trimethoxysilyl)propyl]succinic anhydride; phenylsilane-based compounds such as phenyltrimethoxysilane, phenyltriethoxysilane, dimethoxymethylphenylsilane, diethoxymethylphenylsilane and p-tolyltrimethoxysilane; and arylsilane-based compounds such as trimethoxy(1-naphthyl)silane. One of these silane coupling agents can be used, or two or more thereof can be appropriately mixed and used.

In the resin composition, the total content of the silane coupling agent is normally 0.1 to 10 parts by mass based on 100 parts by mass of the resin solid content in the resin composition.

The wetting and dispersing agent is not particularly limited as long as it is a dispersion stabilizer used for a paint. Specific examples of the wetting and dispersing agent include a wetting and dispersing agent such as DISPERBYK (registered trademark)-110 (product name), 111 (product name), 118 (product name), 180 (product name), and 161 (product name), BYK (registered trademark)-W996 (product name), W9010 (product name), and W903 (product name) manufactured by BYK Japan KK. One of these wetting and dispersing agents can be used, or two or more thereof can be appropriately mixed and used.

In the resin composition, the total content of the wetting and dispersing agent is normally 0.1 to 10 parts by mass based on 100 parts by mass of the resin solid content in the resin composition.

[Organic Solvent]

The resin composition may contain an organic solvent if required. When an organic solvent is used, the viscosity can be adjusted during the preparation of the resin composition. The type of the organic solvent is not particularly limited as long as it is capable of dissolving a part of or all of the resin in the resin composition. Specific examples thereof include ketones such as acetone, methyl ethyl ketone, and methyl isobutyl ketone; alicyclic ketones such as cyclopentanone, and cyclohexanone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, ethyl lactate, methyl methoxypropionate, methyl hydroxyisobutyrate, and y-butyrolactone; polar solvents such as amides such as dimethylacetamide and dimethylformamide; and nonpolar solvents such as aromatic hydrocarbons such as toluene and xylene.

One of these organic solvents can be used, or two or more thereof can be appropriately mixed and used.

Additional Component

In the resin composition, a variety of polymer compounds such as thermosetting resins, thermoplastic resins and oligomers thereof, and elastomers, which have not been mentioned before; flame retardant compounds, which have not been mentioned before; additive agents and the like can also be used in combination to the extent that the characteristics of the present embodiment are not impaired. These are not particularly limited as long as they are those generally used. Examples of the flame retardant compound include a nitrogen containing compound such as melamine and benzoguanamine, a phosphorus compound such as a phosphate compound, an aromatic fused phosphate ester, and a halogen containing fused phosphate ester. Examples of the additive agent include an ultraviolet absorbing agent, an antioxidant, a fluorescent brightening agent, a photosensitizer, a dye, a pigment, a thickening agent, a lubricant, a defoaming agent, a surface conditioner, a brightening agent, a polymerization inhibitor and a curing accelerator. One of these components can be used, or two or more thereof can be appropriately mixed and used.

In the resin composition, the content of the additional compounds are normally each 0.1 to 10 parts by mass based on 100 parts by mass of the resin solid content in the resin composition.

(Method for Producing Resin Composition)

The resin composition is prepared by appropriately mixing the maleimide compound (A), and the photo initiator (B), and if required, the resin or compound other than the maleimide compound (A), the filler, the additional compound, the additive agent, and the like. The resin composition can be suitably used as a varnish upon fabricating a resin sheet of the present embodiment, which will be mentioned later. The organic solvent used for preparation of varnish is not particularly limited, and specific examples thereof are as described above.

Examples of the method for producing the resin composition include a method in which each of the components described above is sequentially compounded in a solvent and stirred sufficiently.

Upon producing the resin composition, publicly known treatment (stirring, mixing, and kneading treatment and the like) for uniformly dissolving or dispersing each component can be carried out, if required. Specifically, by using a stirring tank equipped with a stirrer having an appropriate stirring capacity to carry out the stirring and dispersion treatment, the dispersibility of the maleimide compound (A), the filler, and the like in the resin composition can be improved. The stirring, mixing and kneading treatment can be appropriately carried out by using a publicly known apparatus such as a stirring apparatus intended for dispersion such as an ultrasonic homogenizer; an apparatus intended for mixing such as a three roll mill, a ball mill, a bead mill and a sand mill; or a revolution or rotation mixing apparatus. In addition, upon preparing the resin composition, an organic solvent can be used if required. The type of the organic solvent is not particularly limited as long as it is capable of dissolving the resin in the resin composition, and specific examples thereof are as described above.

The resin composition can be suitably used as a varnish upon fabricating a resin sheet of the present embodiment, which will be mentioned later. The varnish can be obtained by a publicly known method. For example, the varnish can be obtained by adding 10 to 900 parts by mass of an organic solvent to 100 parts by mass of components other than the organic solvent in the resin composition of the present embodiment and carrying out the publicly known mixing treatment (stirring, kneading treatment or the like).

Application

The resin composition can be used in applications where an insulation resin composition is required, and the applications are not particularly limited. For example, the resin composition can be used for applications including a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin. Among the above, the resin composition can be suitably used for an insulation layer of a multilayer printed wiring board and for a solder resist because it is excellent in photocurability, heat resistance, and thermal stability.

[Cured Product]

The cured product of the present embodiment is formed by curing the resin composition. The cured product can be obtained by, for example, melting the resin composition or dissolving the resin composition in a solvent, then pouring the resin composition into a mold, and curing the resin composition with heat, light, or the like under normal conditions. In the case of thermosetting, the curing temperature is preferably in the range of 120 to 300° C. from the viewpoint of efficiently promoting curing and preventing the deterioration of the obtained cured product. In the case of photocuring, it is preferable to cure the resin composition in a light wavelength range of 100 to 500 nm where curing is efficiently promoted by a photo initiator or the like.

[Resin Sheet]

A resin sheet of the present embodiment is a resin sheet with a support containing: a support; and a resin layer disposed on one surface or both surfaces of the support, wherein the resin layer contains the resin composition. The resin sheet can be produced by applying the resin composition onto the support and drying it. The resin layer in the resin sheet has excellent insulation reliability, heat resistance, and thermal stability.

As the support, those publicly known can be used, and a resin film is preferable. Examples of the resin film include a polyimide film, a polyamide film, a polyester film, a polyethylene terephthalate (PET) film, a polybutylene terephthalate (PBT) film, a polypropylene (PP) film, a polyethylene (PE) film, a polyethylene naphthalate film, a polyvinyl alcohol film and a triacetyl acetate film. Among the above, PET film is preferable.

Preferably, the surface of the resin film is coated with a release agent in order to facilitate release from the resin layer. The thickness of the resin film is preferably in the range of 5 to 100 μm and more preferably in the range of 10 to 50 μm. When the thickness is less than 5 μm, the support tends to be easily torn at the time when the support is released before development, and when the thickness is greater than 100 μm, the resolution upon being exposed through the support tends to be reduced.

In addition, in order to reduce light scattering during exposure, it is preferable that the resin film should have excellent transparency.

Furthermore, in the resin sheet, the resin layer thereof may be protected with a protective film.

By protecting the resin layer side with a protective film, adhesion of dust and the like to the surface of the resin layer and scratches can be prevented. As the protective film, a film composed of a material similar to the resin film can be used. The thickness of the protective film is preferably in the range of 1 to 50 μm and more preferably in the range of 5 to 40 μm. If the thickness is less than 1 μm, the handleability of the protective film tends to be reduced, and if the thickness is greater than 50 μm, the inexpensiveness tends to be poor. Note that it is preferable for the protective film to have a smaller adhesive force between the resin layer and the protective film than the adhesive force between the resin layer and the support.

Examples of the method for producing the resin sheet include a method in which the resin composition is applied to a support such as PET film and the organic solvent is removed by drying to produce the resin sheet.

The application method can be carried out by a publicly known method using, for example, a roll coater, a comma coater, a gravure coater, a die coater, a bar coater, a lip coater, a knife coater, a squeeze coater, or the like. The drying can be carried out by, for example, a method of heating in a dryer at 60 to 200° C. for 1 to 60 minutes.

The amount of organic solvent remaining in the resin layer is preferably less than 5% by mass based on the total mass of the resin layer from the viewpoint of preventing diffusion of the organic solvent in the subsequent steps. It is preferable that the thickness of the resin layer should be 1 to 50 μm from the viewpoint of improving handleability.

The resin sheet can be used for production of insulation layers of multilayer printed wiring boards.

[Multilayer Printed Wiring Board]

The multilayer printed wiring board of the present embodiment contains an insulation layer; and a conductor layer formed on one surface or both surfaces of the insulation layer, wherein the insulation layer contains the resin composition. The insulation layer can also be obtained by, for example, laminating one or more of the resin sheets and curing them. The numbers of lamination in the insulation layer and the conductor layer can be appropriately set according to an intended application. The order of the insulation layer and the conductor layer is not particularly limited. The conductor layer may be a metal foil used for various printed wiring board materials, and examples thereof include metal foils of copper, aluminum and the like. Examples of the copper metal foil include a rolled copper foil and an electrolytic copper foil. The thickness of the conductor layer is normally 1 to 100 μm. Specifically, it can be produced by the following method.

(Lamination Step)

In a lamination step, the resin layer side of the resin sheet is laminated to one surface or both surfaces of a circuit substrate using a vacuum laminator. Examples of the circuit substrate include, for example, a glass epoxy substrate, a metal substrate, a ceramic substrate, a silicon substrate, a semiconductor sealing resin substrate, a polyester substrate, a polyimide substrate, a BT resin substrate, and a thermosetting polyphenylene ether substrate. Note that a circuit substrate refers to a substrate in which a patterned conductor layer (circuit) is formed on one surface or both surfaces of a substrate as described above. Also, in a multilayer printed wiring board formed by alternately laminating a conductor layer and an insulation layer, a substrate in which one surface or both surfaces of the outermost layer of the multilayer printed wiring board are patterned conductor layers (circuits) is also included in the circuit substrate. Note that the insulation layer laminated on the multilayer printed wiring board may be an insulation layer obtained by laminating and curing one or more resin sheets of the present embodiment, or an insulation layer obtained by laminating one or more resin sheets of the present embodiment and one or more publicly known resin sheets different from the resin sheet of the present embodiment. Note that the mode in which the resin sheets of the present embodiment and the publicly known resin sheets different from the resin sheet of the present embodiment are laminated is not particularly limited.

The surface of the conductor layer may be subjected to blackening treatment and/or roughening treatment by copper etching or the like in advance. In the lamination step, when the resin sheet has a protective film, the protective film is peeled off and removed. Then, the resin sheet and the circuit substrate are preheated if required, and while pressurizing and heating the resin layer of the resin sheet, it is crimped to the circuit substrate. In the present embodiment, a method of laminating the resin layer of the resin sheet to the circuit substrate under reduced pressure using a vacuum lamination method is suitably used.

As conditions of the lamination step, for example, it is preferable to perform the lamination under reduced pressure with a crimping temperature (lamination temperature) of 50 to 140° C., crimping pressure of 1 to 15 kgf/cm$^2$, crimping time of 5 to 300 seconds, and air pressure of 20 mmHg or less. Also, the lamination step may be in a batch type or in a continuous type using a roll. The vacuum lamination method can be carried out using a commercially available vacuum laminator. Examples of the commercially available vacuum laminator include a two-stage build-up laminator manufactured by Nikko-Materials Co., Ltd.

(Exposure Step)

In an exposure step, after providing the resin layer on the circuit substrate by the lamination step, a predetermined portion of the resin layer is irradiated with an active energy ray as a light source to cure the resin layer in the irradiated part.

The irradiation may be performed through a mask pattern or may be performed by using the direct drawing method in which the irradiation is directly applied. Examples of the active energy ray include ultraviolet rays, visible rays of light, electron beam, and X-rays. The wavelength of the active energy ray is, for example, in the range of 200 to 600 nm. When an ultraviolet ray is used, the irradiation amount thereof is approximately 10 to 1000 mJ/cm$^2$. In addition, upon producing a printed wiring board having a highly dense and highly detailed wiring formation (pattern) using the direct imaging method, it is preferable to use, for example, an active energy ray including a wavelength of 405 nm (h-line) as an active energy ray. When an active energy ray including a wavelength of 405 nm (h-line) is used, the irradiation amount is approximately 10 to 10,000 mJ/cm$^2$.

There are two exposure methods for passing through the mask pattern: the contact exposure method, in which the mask pattern is adhered to the multilayer printed wiring board, and the non-contact exposure method, in which parallel light rays are used to perform the exposure without adhering the mask pattern to the multilayer printed wiring board, but either method may be used. Also, when a support is present on the resin layer, it may be exposed from the top of the support, or it may be exposed after the support is removed.

(Development Step)

When a support is not present on the resin layer, a portion which is not photocured in wet development (unexposed portion) is removed after the exposure step, and development is performed, whereby an insulation layer pattern can be formed.

When a support is present on the resin layer, the support is removed after the exposure step, and thereafter a portion which is not photocured in wet development (unexposed portion) is removed, and development is performed, whereby an insulation layer pattern can be formed.

In the case of wet development, the developing solution is not particularly limited as long as unexposed portion is selectively eluted. For example, organic solvents such as cyclohexanone, cyclopentanone, and γ-butyrolactone; alkaline developing solutions such as an aqueous tetramethylammonium hydroxide solution, an aqueous sodium carbonate solution, an aqueous potassium carbonate solution, an aqueous sodium hydroxide solution and an aqueous potassium hydroxide solution are used. One of these developing solutions can be used, or two or more thereof can be appropriately mixed and used.

As the development method, for example, a known method such as dipping, paddling, spraying, shaking immersion, blushing and scraping can be carried out. In pattern formation, these development methods can be used in combination if necessary. As the development method, use of a high-pressure spray is suitable because the resolution is further improved. When the spraying method is employed, the spray pressure is preferably 0.02 to 0.5 MPa.

(Postbaking Step)

In the present embodiment, a postbaking step is carried out after the development step, thereby forming an insulation layer (cured product). Examples of the postbaking step include an ultraviolet irradiation step with a high pressure mercury lamp and a heating step using a clean oven, and these steps may be used in combination as well. When irradiating with ultraviolet ray, the irradiation amount thereof can be adjusted if required, and for example, the irradiation can be carried out at an irradiation amount of approximately 50 to 10,000 mJ/cm². Also, the conditions of heating can be appropriately selected if required, but they are preferably selected from the range of 20 to 180 minutes at 150 to 220° C., and more preferably from the range of 30 to 150 minutes at 160 to 200° C.

(Conductor Layer Formation Step)

After forming the insulation layer (cured product), a conductor layer is formed on the surface of the insulation layer by dry plating. For the dry plating, a publicly known method such as a vapor deposition method, a sputtering method, and an ion plating method can be used. In the vapor deposition method (vacuum deposition method), for example, a metallic film can be formed on the insulation layer by placing the multilayer printed wiring board in a vacuum container and heating and evaporating the metal. In the sputtering method as well, for example, the multilayer printed wiring board is placed in a vacuum container, an inert gas such as argon is introduced, a direct current voltage is applied, the ionized inert gas is brought into collision with the target metal, and the knocked-out metal can be used to form a metallic film on the insulation layer.

Next, a conductor layer is formed by nonelectrolytic plating or electroplating. As a method of subsequent pattern formation, for example, a subtractive method, a semi-additive method, or the like can be used.

[Semiconductor Device]

A semiconductor device of the present embodiment contains the resin composition. Specifically, it can be produced by the following method. A semiconductor device can be produced by mounting a semiconductor chip at the conduction points on the multilayer printed wiring board. Here, the conduction points refer to the points in the multilayer printed wiring board where electrical signals are conveyed, and the locations thereof may be on the surface or at embedded points. In addition, the semiconductor chip is not particularly limited as long as they are electrical circuit elements made of semiconductors.

The method for mounting the semiconductor chip upon producing the semiconductor device is not particularly limited as long as the semiconductor chip effectively functions, but specific examples thereof include a wire bonding mounting method, a flip chip mounting method, a mounting method with a bumpless build-up layer (BBUL), a mounting method with an anisotropic conductive film (ACF), and a mounting method with a non-conductive film (NCF).

Alternatively, the semiconductor device can be produced by forming an insulation layer containing the resin composition on a semiconductor chip or a substrate on which semiconductor chip is mounted. The shape of the substrate on which semiconductor chip is mounted may be wafer-like or panel-like. After the formation, the semiconductor device can be produced using the same method as the multilayer printed wiring board described above.

EXAMPLES

The present embodiment will be more specifically described below using Examples and Comparative Examples. The present embodiment is not limited in any way by the following Examples.

[Synthetic Example 1] Synthesis of Maleimide Compound (Hereinafter, Abbreviated as TMDM)

The TMDM represented by the formula (2) was synthesized as follows.

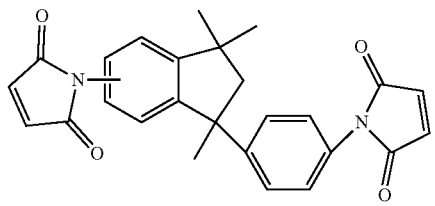

(2)

<Synthesis of Amic Acid Compound (Hereinafter, Abbreviated as MA-TMDA)>

First, the MA-TMDA represented by the formula (25) was synthesized by the following method.

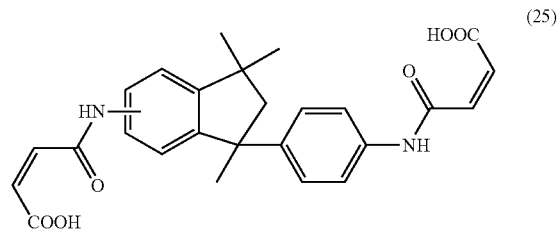

(25)

To a 100 mL four necked flask equipped with an argon inlet, a Dean-Stark apparatus, a Dimroth condenser, and a thermometer, 5.2 g (53 mmol) of maleic anhydride, 20 mL of N-methylpyrrolidone (NMP), and 20 mL of toluene were added, and the mixture was stirred at room temperature in an argon stream to completely dissolve maleic anhydride. To this solution, 5.0 g (19 mmol) of TMDA (manufactured by Nipponjunryo Chemicals Co., Ltd., mixture of 5-amino-1,3,3-trimethyl-1-(4-aminophenyl)-indane and 6-amino-1,3,3-trimethyl-1-(4-aminophenyl)-indane) and 10 mL of NMP were added, and the mixture was stirred at room temperature for 17 hours.

A portion of the reaction solution was collected, to which water and ethyl acetate were added, and the mixture was shaken. Then, the organic layer was removed and dried over magnesium sulfate. The solvent of the supernatant was distilled off at 40° C. to obtain a yellow oil. $^1$H-NMR measurement was carried out to confirm that it was the MA-TMDA represented by the formula (25).

The assignment of the $^1$H-NMR spectrum of the MA-TMDA represented by the formula (25) is shown below. The $^1$H-NMR chart is shown in FIG. 1.

$^1$H-NMR (300 MHz, DMSO-d6) δ (ppm): 10.40 (m, 2H, —COOH), 7.30 (m, 7H, ArH), 6.33 (m, 4H, =CH—), 2.11 (m, 2H, —CH$_2$—), 1.48 (d, 3H, —CH$_3$), 1.21 (d, 3H, —CH$_3$), 0.92 (d, 3H, —CH$_3$)

<Synthesis of TMDM>

To the above reaction solution, 0.67 g (3.5 mmol) of p-toluenesulfonic acid monohydrate was added, and the mixture was heated under reflux at 127° C. for 2.5 hours. After cooling to room temperature, the cooled reaction solution was poured into a mixed solution of 50 mL of a saturated aqueous sodium hydrogen carbonate solution and 100 mL of ethyl acetate while stirring. Further, 100 mL of water and 100 mL of ethyl acetate were added, and the mixture was stirred and allowed to stand for 5 minutes. Then, the mixture was separated, and the aqueous layer was extracted three times with 50 mL of ethyl acetate. All the organic layers were combined and washed once with 100 mL of water, once with 10 mL of saturated brine, and twice with 5 mL of saturated brine. After drying over magnesium sulfate and filtering off the solid content, the solvent was distilled off at 40° C. to obtain a yellow solid.

The obtained yellow solid was dissolved in 6.5 mL of acetone, and the acetone solution was poured into 300 mL of water. The precipitated solid was collected by filtration, washed with a small amount of isopropyl alcohol (IPA), and then dried under reduced pressure at 50° C. for 20 hours to obtain 5.71 g of a yellow solid. $^1$H-NMR measurement was carried out to confirm that it was the maleimide compound (TMDM) represented by the formula (2).

The assignment of the $^1$H-NMR spectrum of the TMDM represented by the formula (2) is shown below. The $^1$H-NMR chart is shown in FIG. 2.

$^1$H-NMR (300 MHz, DMSO-d6) δ (ppm): 7.19 (m, 11H, ArH, —CH=CH—), 2.42 (m, 2H, —CH$_2$—), 1.66 (d, 3H, —CH$_3$), 1.32 (d, 3H, —CH$_3$), 1.00 (d, 3H, —CH$_3$)

[Evaluation of Raw Material]
[Transmittance and Absorbance]

Using the TMDM obtained in Synthesis Example 1 as the maleimide compound (A), a chloroform solution containing 1% by mass of this TMDM was prepared, and measurement of the transmittance at a wavelength of 405 nm was carried out using a UV-vis measuring apparatus (Hitachi Spectrophotometer U-4100 manufactured by Hitachi High-Tech Science Corporation).

In the same manner, measurement of the transmittance at a wavelength of 405 nm was carried out using MIZ-001 (product name, mass average molecular weight (Mw): 3000) manufactured by Nippon Kayaku Co., Ltd. as another maleimide compound.

In the same manner, measurement of the transmittance at a wavelength of 405 nm was carried out using a maleimide compound (BMI-80 (product name) manufactured by K.I Chemical Industry Co., LTD.).

In the same manner, a chloroform solution containing 0.01% by mass of bis(2,4,6-trimethylbenzoyl)-phenylphosphine oxide (Omnirad (registered trademark) 819 manufactured by IGM Resins B.V.) as the photo initiator (B), and measurement of the absorbance at a wavelength of 405 nm was carried out using an ultraviolet-visible spectrophotometer (Hitachi Spectrophotometer U-4100 manufactured by Hitachi High-Tech Science Corporation).

In the same manner, 2-benzyl-2-dimethylamino-1-(4-morpholinophenyl)-butanone-1 (Omnirad (registered trademark) 369 manufactured by IGM Resins B.V.) and 2-methyl-1-[4-(methylthio)phenyl]-2-morpholinopropan-1-one (Omnirad (registered trademark) 907 manufactured by IGM Resins B.V.) were used as the photo initiators, and measurement of the absorbance at a wavelength of 405 nm of a 0.01% by mass of chloroform solution was carried out.

The results are shown in Table 1.

TABLE 1

|  |  | Transmittance at 405 nm [%] | Absorbance at 405 nm [—] |
|---|---|---|---|
| Maleimide Compound (A) | TMDM | 0.01 | — |
| Other Maleimide Compound | MIZ-001 | 88 | — |
| Maleimide Compound | BMI-80 | 0.005 | — |
| Photo Initiator (B) | Omnirad819 | — | 0.18 |
| Photo Initiator | Omnirad369 | — | 0.04 |
|  | Omnirad907 | — | 0.01 |

Example 1

[Fabrication of Resin Composition and Resin Sheet]

90 parts by mass of the TMDM obtained in Synthesis Example 1 as the maleimide compound (A) and 10 parts by mass of bis(2,4,6-trimethylbenzoyl)-phenylphosphine oxide (Omnirad (registered trademark) 819 manufactured by IGM Resins B.V.) as the photo initiator (B) were mixed, diluted with 100 parts by mass of methyl ethyl ketone (manufactured by Idemitsu Kosan Co., Ltd.), and then stirred with an ultrasonic homogenizer, thereby obtaining a varnish. This varnish is applied onto a PET film with a thickness of 38 μm (Unipeel (registered trademark) TR1-38 (product name), manufactured by UNITIKA LTD.) using an auto film applicator (PI-1210 (product name) manufactured by TESTER SANGYO CO., LTD.) and heated and dried at 90° C. for 5 minutes, thereby obtaining a resin sheet having the PET film as a support and a resin layer with a thickness of 30 μm.

(Fabrication of Laminate for Evaluation)

The two obtained resin sheets were laminated so that the resin surfaces face each other, and a vacuum laminator (CVP-600 (product name), manufactured by Nikko-Materials Co., Ltd.) was used to perform vacuum drawing (ultimate pressure: 5.0 kPa or less) for 30 seconds, followed by lamination molding at a pressure of 10 kgf/cm$^2$ and a temperature of 70° C. for 30 seconds. Furthermore, by performing lamination molding at a pressure of 10 kgf/cm$^2$ and a temperature of 70° C. for 60 seconds, a laminate for evaluation with supports on both surfaces was obtained.

Example 2

72 parts by mass of TMDM as the maleimide compound (A), 18 parts by mass of MIZ-001 (product name) manufactured by Nippon Kayaku Co., Ltd. as the other maleimide compound, and 10 parts by mass of bis(2,4,6-trimethylbenzoyl)-phenylphosphine oxide (Omnirad (registered trademark) 819 manufactured by IGM Resins B.V.) as the photo initiator (B) were mixed, diluted with 100 parts by mass of methyl ethyl ketone (manufactured by Idemitsu Kosan Co., Ltd.), and then stirred with an ultrasonic homogenizer, thereby obtaining a varnish. Using the obtained varnish, a resin sheet and a laminate for evaluation were obtained in the same manner as in Example 1.

Example 3

54 parts by mass of TMDM as the maleimide compound (A), 36 parts by mass of MIZ-001 (product name) manufactured by Nippon Kayaku Co., Ltd. as the other maleimide compound, and 10 parts by mass of bis(2,4,6-trimethylbenzoyl)-phenylphosphine oxide (Omnirad (registered trademark) 819 manufactured by IGM Resins B.V.) as the photo initiator (B) were mixed, diluted with 100 parts by mass of methyl ethyl ketone (manufactured by Idemitsu Kosan Co., Ltd.), and then stirred with an ultrasonic homogenizer, thereby obtaining a varnish. Using the obtained varnish, a resin sheet and a laminate for evaluation were obtained in the same manner as in Example 1.

Example 4

36 parts by mass of TMDM as the maleimide compound (A), 54 parts by mass of MIZ-001 (product name) manufactured by Nippon Kayaku Co., Ltd. as the other maleimide compound, and 10 parts by mass of bis(2,4,6-trimethylbenzoyl)-phenylphosphine oxide (Omnirad (registered trademark) 819 manufactured by IGM Resins B.V.) as the photo initiator (B) were mixed, diluted with 100 parts by mass of methyl ethyl ketone (manufactured by Idemitsu Kosan Co., Ltd.), and then stirred with an ultrasonic homogenizer, thereby obtaining a varnish. Using the obtained varnish, a resin sheet and a laminate for evaluation were obtained in the same manner as in Example 1.

Example 5

18 parts by mass of TMDM as the maleimide compound (A), 72 parts by mass of MIZ-001 (product name) manufactured by Nippon Kayaku Co., Ltd. as the other maleimide compound, and 10 parts by mass of bis(2,4,6-trimethylbenzoyl)-phenylphosphine oxide (Omnirad (registered trademark) 819 manufactured by IGM Resins B.V.) as the photo initiator (B) were mixed, diluted with 100 parts by mass of methyl ethyl ketone (manufactured by Idemitsu Kosan Co., Ltd.), and then stirred with an ultrasonic homogenizer, thereby obtaining a varnish. Using the obtained varnish, a resin sheet and a laminate for evaluation were obtained in the same manner as in Example 1.

Comparative Example 1

A resin sheet was obtained in the same manner as in Example 1 except that 10 parts by mass of Omnirad (registered trademark) 369 was used as the photo initiator instead of Omnirad (registered trademark) 819. Using this resin sheet, a laminate for evaluation was obtained in the same manner as in Example 1.

Comparative Example 2

A resin sheet was obtained in the same manner as in Example 1 except that 10 parts by mass of Omnirad (registered trademark) 907 was used as the photo initiator instead of Omnirad (registered trademark) 819. Using this resin sheet, a laminate for evaluation was obtained in the same manner as in Example 1.

Comparative Example 3

A resin sheet was obtained in the same manner as in Example 1 except that 90 parts by mass of a maleimide compound (BMI-80 (product name) manufactured by K.I Chemical Industry Co., LTD.) was used instead of the maleimide compound (A) (TMDM obtained in Synthesis Example 1). Using this resin sheet, a laminate for evaluation was obtained in the same manner as in Example 1.

Comparative Example 4

116.9 parts by mass (76 parts by mass in terms of non-volatile portions) of a TrisP-PA epoxy acrylate (KAYARAD (registered trademark) ZCR-6007H, manufactured by Nippon Kayaku Co., Ltd., non-volatile portions 65% by mass, acid value: 70 mg KOH/g), 16 parts by mass of dipentaerythritol hexaacrylate (KAYARAD (registered trademark) DPHA, manufactured by Nippon Kayaku Co., Ltd.), and 8 parts by mass of Omnirad (registered trademark) 819 as the photo initiator (B) were mixed, diluted with 100 parts by mass of methyl ethyl ketone (manufactured by Idemitsu Kosan Co., Ltd.), and then stirred with an ultrasonic homogenizer, thereby obtaining a varnish. This varnish is applied onto a PET film with a thickness of 38 µm (Unipeel (registered trademark) TR1-38 (product name), manufactured by UNITIKA LTD.) using an auto film applicator (PI-1210, manufactured by TESTER SANGYO CO., LTD.) and heated and dried at 80° C. for 7 minutes, thereby obtaining a resin sheet having the PET film as a support and a resin layer with a thickness of 30 µm. Using this resin sheet, a laminate for evaluation was obtained in the same manner as in Example 1.

Comparative Example 5

105.9 parts by mass (72 parts by mass in terms of non-volatile portions) of a bisphenol F-based epoxy acrylate (KAYARAD (registered trademark) ZFR-1553H, manufactured by Nippon Kayaku Co., Ltd., non-volatile portions 68% by mass, acid value: 70 mg KOH/g), 19 parts by mass of dipentaerythritol hexaacrylate (KAYARAD (registered trademark) DPHA, manufactured by Nippon Kayaku Co., Ltd.), and 9 parts by mass of Omnirad (registered trademark) 819 as the photo initiator (B) were mixed, diluted with 100 parts by mass of methyl ethyl ketone (manufactured by Idemitsu Kosan Co., Ltd.), and then stirred with an ultrasonic homogenizer, thereby obtaining a varnish. This varnish is applied onto a PET film with a thickness of 38 µm (Unipeel (registered trademark) TR1-38 (product name), manufactured by UNITIKA LTD.) using an auto film applicator (PI-1210, manufactured by TESTER SANGYO CO., LTD.) and heated and dried at 80° C. for 7 minutes, thereby obtaining a resin sheet having the PET film as a support and a resin layer with a thickness of 30 µm. Using this resin sheet, a laminate for evaluation was obtained in the same manner as in Example 1.

[Measurement and Evaluation of Physical Properties]

Using the laminate for evaluation prepared by the above method, evaluation was performed by the following method. The results are shown in Table 2.

<Photocurability>

By using a photo DSC (DSC-2500 (product name) manufactured by TA Instruments Japan Inc.) equipped with a light source (Omnicure (registered trademark) S2000 (product name) manufactured by U-VIX Corporation) that is capable of being irradiated with an active energy ray including a wavelength of 405 nm, the obtained laminate for evaluation was irradiated at an illuminance of 30 mW and for an exposure time of 3.5 minutes, thereby obtaining a graph of time (sec) on the horizontal axis and heat flow (mW) on the vertical axis. The enthalpy (J/g) was defined as the peak area when a line was drawn horizontally from the endpoint of the graph. The photocurability was evaluated in accordance with the following criteria.

"AA": enthalpy was 1 (J/g) or more.
"CC": enthalpy was less than 1 (J/g).

<Thermal Stability>

The laminate for evaluation photocured in the photocurability test was heated at 180° C. for 120 minutes, and then the PET film, which is the support, was peeled off on both sides to obtain a cured product for evaluation.

The mass of the obtained cured product for evaluation was measured under a nitrogen atmosphere at a measurement start temperature of 20° C., an end temperature of 500° C., and a temperature increase rate of 10° C./min using a simultaneous differential thermal mass measuring device (TG/DTA 6200 (product name), manufactured by Hitachi High-Tech Science Corporation). The temperature at which the mass reduction rate became 5% was evaluated as thermal stability (° C.).

TABLE 2

| | | | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|---|---|
| Parts by Mass | Maleimide Compound (A) | TMDM | 90 | 72 | 54 | 36 | 18 | 90 | 90 | — | — | — |
| | Maleimide Compound | MIZ-001 | — | 18 | 36 | 54 | 72 | — | — | — | — | — |
| | | BMI-2300 | — | — | — | — | — | — | — | 90 | — | — |
| | Acrylate | ZCR-6007H | — | — | — | — | — | — | — | — | 76 | — |
| | | ZFR-1553H | — | — | — | — | — | — | — | — | — | 72 |
| | | DPHA | — | — | — | — | — | — | — | — | 16 | 19 |
| | Photo Initiator (B) | Omnirad819 | 10 | 10 | 10 | 10 | 10 | — | — | 10 | 8 | 9 |
| | Photo Initiator | Omnirad369 | — | — | — | — | — | 10 | — | — | — | — |
| | | Omnirad907 | — | — | — | — | — | — | 10 | — | — | — |
| Evaluation Results | Photocurability | | AA | AA | AA | AA | AA | CC | CC | CC | AA | AA |
| | 5% Mass Reduction Temperature [° C.] | | 412 | 363 | 371 | 370 | 349 | — | — | — | 175 | 172 |

As is evident from Table 2, the resin compositions of the present embodiments are satisfactorily light-sensitive and are capable of being photo-cured when exposed with an active energy ray including a wavelength of 405 nm (h-line). In addition, the cured product obtained from the resin composition of the present embodiment exhibits superior heat resistance compared to an acrylate-based resin.

The present application is based on Japanese Patent Application No. 2019-122162 filed on Jun. 28, 2019, the contents of which are incorporated herein by reference.

INDUSTRIAL APPLICABILITY

The resin composition of the present embodiment exhibits excellent photocurability, heat resistance, and thermal stability, and is therefore industrially useful, and can be used for applications including, for example, a photosensitive film, a photosensitive film with a support, a prepreg, a resin sheet, a circuit substrate (applications for a laminate, applications for a multilayer printed wiring board, and the like), a solder resist, an underfill material, a die bonding material, a semiconductor sealing material, a hole filling resin, and a component embedding resin.

The invention claimed is:

1. A resin composition comprising:
   a maleimide compound (A) represented by the following formula (1);
   a photo initiator (B) having an absorbance of 0.1 or more at a wavelength of 405 nm (h-line); and
   a maleimide compound represented by the following formula (18);
   wherein a content of the maleimide compound (A) is 10 to 95 parts by mass based on 100 parts by mass of the resin solid content in the resin composition, and
   wherein a content of the maleimide compound represented by the following formula (18) is 5 to 90 parts by mass based on 100 parts by mass of the resin solid content in the resin composition:

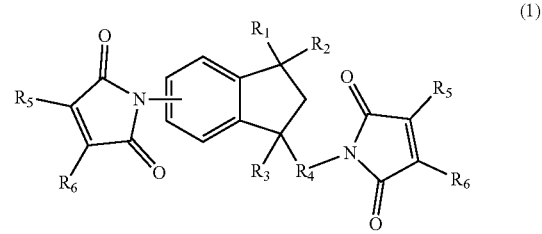

(1)

wherein $R_1$, $R_2$, and $R_3$ each independently represent an alkyl group or an alkoxy group which may have a hydrogen atom, a halogen atom, a hydroxyl group, or a substituent, $R_4$ represents an alkylene group, an alkenylene group, an alkoxylene group, or an arylene group which may have a substituent, and $R_5$ and $R_6$ each independently represent a hydrogen atom, a linear alkyl group having 1 to 6 carbon atoms, a branched alkyl group having 3 to 6 carbon atoms, a linear alkenyl group having 1 to 6 carbon atoms, or a branched alkenyl group having 4 to 6 carbon atoms; and

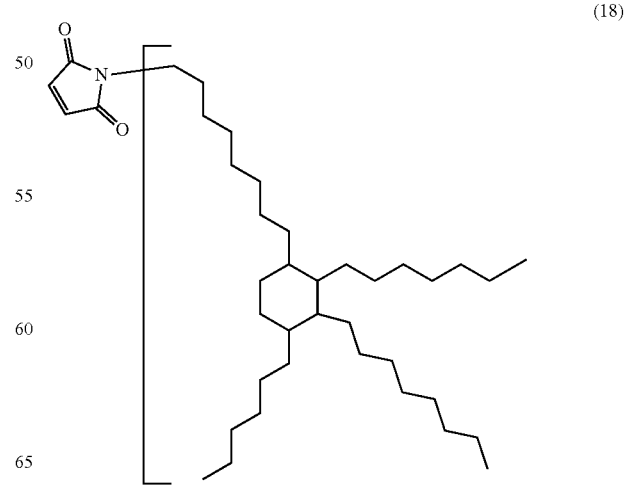

(18)

-continued

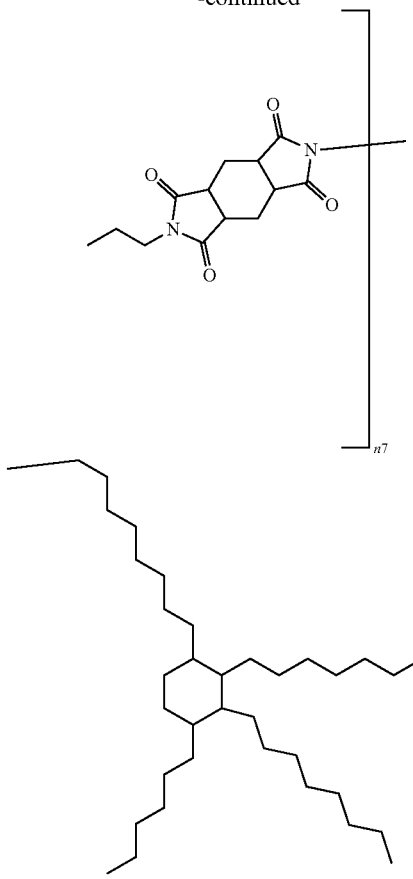

wherein n7 represents an integer of 1 to 10.

2. The resin composition according to claim 1, wherein the maleimide compound (A) comprises a compound represented by the following formula (2):

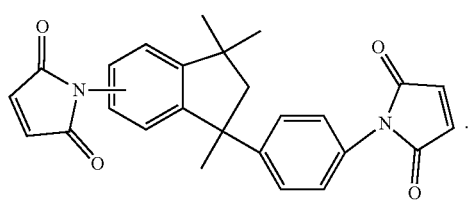 (2)

3. The resin composition according to claim 1, wherein a content of the maleimide compound (A) is 50 to 99.9 parts by mass based on 100 parts by mass in total of the maleimide compound (A) and the photo initiator (B).

4. The resin composition according to claim 1, wherein the photo initiator (B) comprises a compound represented by the following formula (3):

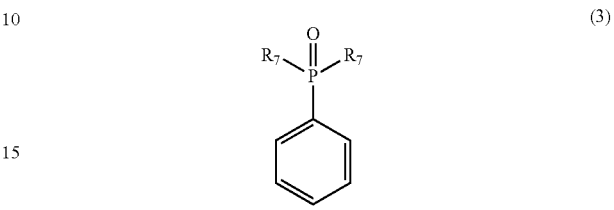 (3)

wherein each $R_7$ independently represents a substituent represented by the following formula (4) or a phenyl group; and

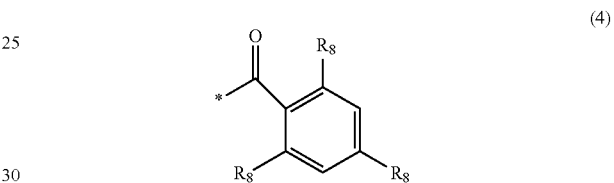 (4)

wherein -* represents a bonding hand, and each $R_8$ independently represents a hydrogen atom or a methyl group.

5. A resin sheet comprising:
a support; and
a resin layer disposed on one surface or both surfaces of the support,
wherein the resin layer comprises the resin composition according to claim 1.

6. The resin sheet according to claim 5, wherein the resin layer has a thickness of 1 to 50 μm.

7. A multilayer printed wiring board comprising:
an insulation layer; and
a conductor layer formed on one surface or both surfaces of the insulation layer,
wherein the insulation layer comprises the resin composition according to claim 1.

8. A semiconductor device comprising the resin composition according to claim 1.

* * * * *